US011347336B2

(12) United States Patent
Seo et al.

(10) Patent No.: US 11,347,336 B2
(45) Date of Patent: May 31, 2022

(54) FLEXIBLE DISPLAY DEVICE

(71) Applicant: SAMSUNG DISPLAY CO., LTD., Yongin-Si (KR)

(72) Inventors: Taean Seo, Hwaseong-si (KR); Sunho Kim, Seongnam-si (KR); Youngseok Seo, Seoul (KR); Junghun Lee, Hwaseong-si (KR); Jinhwan Choi, Seoul (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 3 days.

(21) Appl. No.: 16/870,470

(22) Filed: May 8, 2020

(65) Prior Publication Data

US 2020/0272271 A1      Aug. 27, 2020

Related U.S. Application Data

(62) Division of application No. 15/690,814, filed on Aug. 30, 2017, now Pat. No. 10,684,714.

(30) Foreign Application Priority Data

Sep. 20, 2016  (KR) .......................... 10-2016-0120127

(51) Int. Cl.
    *G06F 3/041*  (2006.01)
    *G06F 3/044*  (2006.01)
    (Continued)

(52) U.S. Cl.
    CPC ............ *G06F 3/0412* (2013.01); *G06F 3/044* (2013.01); *H05K 5/0017* (2013.01);
    (Continued)

(58) Field of Classification Search
    None
    See application file for complete search history.

(56) References Cited

U.S. PATENT DOCUMENTS 6,570,103 B1 *  5/2003  Saka ..................... G06F 3/0416
                                                      178/18.01
2005/0176470 A1   8/2005  Yamakawa
                 (Continued)

FOREIGN PATENT DOCUMENTS

CN       103514814       1/2014
KR    10-2010-0103095    9/2010
                 (Continued)

OTHER PUBLICATIONS

Chinese Office Action issued in corresponding Chinese Patent Application No. 201710853995.X dated Nov. 4, 2020.

*Primary Examiner* — Kent W Chang
*Assistant Examiner* — Benjamin Morales
(74) *Attorney, Agent, or Firm* — F. Chau & Associates, LLC

(57) ABSTRACT

A display device including a touch display panel, a roller housing, a touch bar, and a panel driver. The touch display panel includes a plurality of pixels and a plurality of touch sensing elements. At least a portion of the touch display panel is rolled around a roller. The roller housing is configured to receive the roller and has an opening configured to receive the touch display panel. The touch bar is disposed between the roller housing and the touch display panel and contacts the touch display panel. The panel driver divides a display portion of the touch display panel into a display area and a non-display area according to positions of touch sensing elements contacting the touch bar. The panel driver deactivates at least a portion of the non-display area.

11 Claims, 20 Drawing Sheets

(51) Int. Cl.
*H05K 5/00* (2006.01)
*H05K 5/02* (2006.01)
*H01L 27/32* (2006.01)
*H01L 51/52* (2006.01)

(52) U.S. Cl.
CPC .. *H05K 5/0217* (2013.01); *G06F 2203/04102* (2013.01); *H01L 27/323* (2013.01); *H01L 27/3227* (2013.01); *H01L 51/5237* (2013.01); *H01L 2251/5338* (2013.01)

(56) References Cited

U.S. PATENT DOCUMENTS

| | | | |
|---|---|---|---|
| 2010/0033435 A1* | 2/2010 | Huitema | G06F 1/169 345/173 |
| 2011/0032214 A1* | 2/2011 | Gruhlke | G02B 5/045 345/175 |
| 2011/0115748 A1* | 5/2011 | Xu | G06F 3/0421 345/175 |
| 2012/0038613 A1 | 2/2012 | Choi | |
| 2014/0204037 A1* | 7/2014 | Kim | G06F 3/03 345/173 |
| 2014/0247252 A1 | 9/2014 | Lee | |
| 2014/0292672 A1 | 10/2014 | Choi et al. | |
| 2015/0227173 A1* | 8/2015 | Hwang | G06F 1/1652 345/619 |
| 2016/0187929 A1 | 6/2016 | Kim et al. | |
| 2017/0168638 A1 | 6/2017 | Shi et al. | |
| 2018/0032106 A1* | 2/2018 | Yu | G06F 1/1652 |
| 2018/0081473 A1 | 3/2018 | Seo et al. | |
| 2018/0217679 A1* | 8/2018 | Kwon | H04M 1/72519 |
| 2018/0284964 A1 | 10/2018 | Kang | |

FOREIGN PATENT DOCUMENTS

| | | |
|---|---|---|
| KR | 10-2012-0015890 | 2/2012 |
| KR | 10-2014-0108971 | 9/2014 |
| KR | 10-1570869 | 11/2015 |

* cited by examiner

FLEXIBLE DISPLAY DEVICE

CROSS-REFERENCE TO RELATED APPLICATIONS

This application is a divisional of U.S. patent application Ser. No. 15/690,814 filed on Aug. 30, 2017, which claims priority under 35 U.S.C. § 119 to Korean Patent Application No. 10-2016-0120127, filed on Sep. 20, 2016 in the Korean Intellectual Property Office (KIPO), the disclosures of which are incorporated by reference herein in their entireties.

TECHNICAL FIELD

Exemplary embodiments of the present invention relate to a display device, and more particularly to a flexible display device.

DISCUSSION OF RELATED ART

Flexible display devices are display devices that may be bent or folded. Display devices may include a glass substrate. However, flexible display devices may include a plastic film that may be bent. Flexible display devices may be relatively thin and relatively light-weight. Flexible display devices may also be substantially resistant to impact. Flexible display devices may also be bent or folded. As a result, flexible display devices may be manufactured to have various shapes.

SUMMARY

Exemplary embodiments of the present invention provide a display device, and more particularly, a flexible display device. The flexible display device may have a reduced power consumption and minimized touch errors.

One or more exemplary embodiments of the present invention provide a flexible display device. The flexible display device includes a touch display panel, a roller housing, a touch bar, and a panel driver. The touch display panel includes a plurality of pixels and a plurality of touch sensing elements. A portion of the touch display panel is rolled around a roller. The roller housing is configured to receive the roller. The roller housing has an opening configured to receive the touch display panel. The touch bar is disposed between the roller housing and the touch display panel. The touch bar contacts the touch display panel. The panel driver divides a display portion of the touch display panel into a display area and a non-display area according to positions of touch sensing elements contacting the touch bar. The panel driver deactivates at least a portion of the non-display area.

The touch bar may be disposed adjacent to the opening.

The touch bar may be disposed between the roller housing and the touch display panel. The touch bar may be substantially parallel to a central axis of the roller.

The touch sensing elements may be arranged in columns. The columns may be substantially parallel to a central axis of the roller. The touch bar may selectively contact touch sensing elements in at least one column.

The panel driver may define an area of the display portion between the touch sensing elements contacting the touch bar and a first end of the touch display panel disposed inside the roller housing as the non-display area.

The panel driver may detect a touch line according to the positions of the touch sensing elements contacting the touch bar. The panel driver may define an area of the display portion between the touch line and the first end of the touch display panel disposed inside the roller housing as the non-display area.

When a touch line detected for a predetermined time moves toward a second end of the touch display panel, the panel driver may define an area between the detected touch line and the first end of the touch display panel as the non-display area.

The panel driver may deactivate at least one pixel in the non-display area.

The panel driver may turn off or turn off light emission in at least one pixel in the non-display area.

The panel driver may deactivate at least one touch sensing element in the non-display area.

The panel driver may turn off at least one touch sensing element in the non-display area.

The panel driver may not display an image on at least a portion of the non-display area.

One or more exemplary embodiments of the present invention provide a display device. The display device includes a display panel, a roller housing, a light source unit, and a panel driver. The display panel includes a plurality of pixels and a plurality of light sensing elements. A portion of the display panel is rolled around a roller. The roller housing is configured to receive the roller. The roller housing has an opening configured to receive the display panel. The light source unit is disposed between the roller housing and the display panel. The light source unit irradiates a light toward the display panel. The panel driver divides a display portion of the display panel into a display area and a non-display area according to positions of light sensing elements irradiated with the light from the light source unit. The panel driver deactivates at least a portion of the non-display area.

The light source unit may be disposed adjacent to the opening.

The light source unit may be disposed between the roller housing and the display panel. The light source unit may be substantially parallel to a central axis of the roller.

The light sensing elements may be arranged in columns substantially parallel to a central axis of the roller. The light irradiates from the light source unit may be selectively irradiated to light sensing elements in at least one column.

The light source unit may have a slit through which the light is emitted.

The panel driver may define an area of the display portion between the light sensing elements irradiated with the light from the light source unit and an end of the display panel inside the roller housing as the non-display area.

The panel driver may detect a touch line according to the positions of the light sensing elements irradiated with the light from the light source unit. The panel driver may define an area of the display portion between the touch line and the end of the touch display panel inside the roller housing as the non-display area.

The light irradiated from the light source unit may be an ultraviolet light.

One or more exemplary embodiments of the present invention provide a display device comprising: a touch display panel comprising a plurality of pixels and a plurality of touch sensing elements, wherein at a least a portion of the touch display panel is rolled around each of a first roller and a second roller; a first roller housing configured to receive the first roller and having a first opening configured to receive the touch display panel; a second roller housing configured to receive the second roller and having a second opening configured to receive the touch display panel; a first touch bar disposed between the first roller housing and the touch display panel, the first touch bar contacting the touch display panel; a second touch bar disposed between the first roller housing and the touch display panel, the second touch bar contacting the touch display panel; and a panel driver dividing a display portion of the touch display panel into a display area and a non-display area according to positions of touch sensing elements contacting each of the first touch bar and the second touch bar, wherein the panel driver deactivates at least a portion of the non-display area.

The first touch bar is disposed adjacent to the first opening, and the second touch bar is disposed adjacent to the second opening.

The first touch bar is disposed between the first roller housing and the touch display panel, the first touch bar being substantially parallel to a central axis of the first roller, and the second touch bar is disposed between the second roller housing and the touch display panel, the second touch bar being substantially parallel to a central axis of the second roller.

The the panel driver deactivates at least one pixel or at least one touch sensing element in the non-display area.

The panel driver deactivates at least one pixel, and the panel driver turns off or turns off light emission in the at least one pixel in the non-display area.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
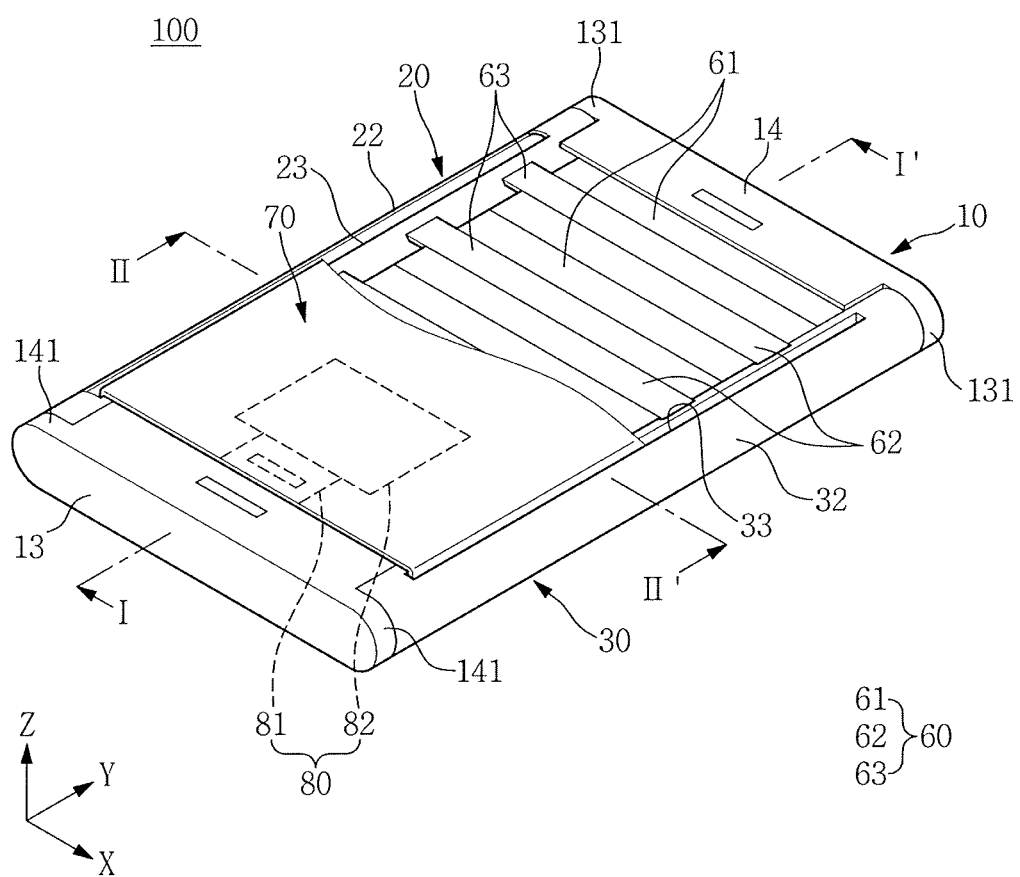
FIG. 1 is a perspective view illustrating a flexible display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements through the specification and drawings.

It will be understood that although the terms "first" and "second" may be used herein to describe various components, these components should not be limited by these terms.

Sizes of elements in the drawings may be exaggerated for clarity of description.

"About" or "approximately" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can refer to within one or more standard deviations, or within ±30%, 20%, 10%, 5% of the stated value.

It will be understood that when a component, such as a layer, a film, a region, or a plat e, is referred to as being "on" another component, the component can be directly on the other component or intervening components may be present.

A flexible display device according an exemplary embodiment of the present invention will be described in more detail below with reference to FIGS. 1 to 20.

Figure 2:
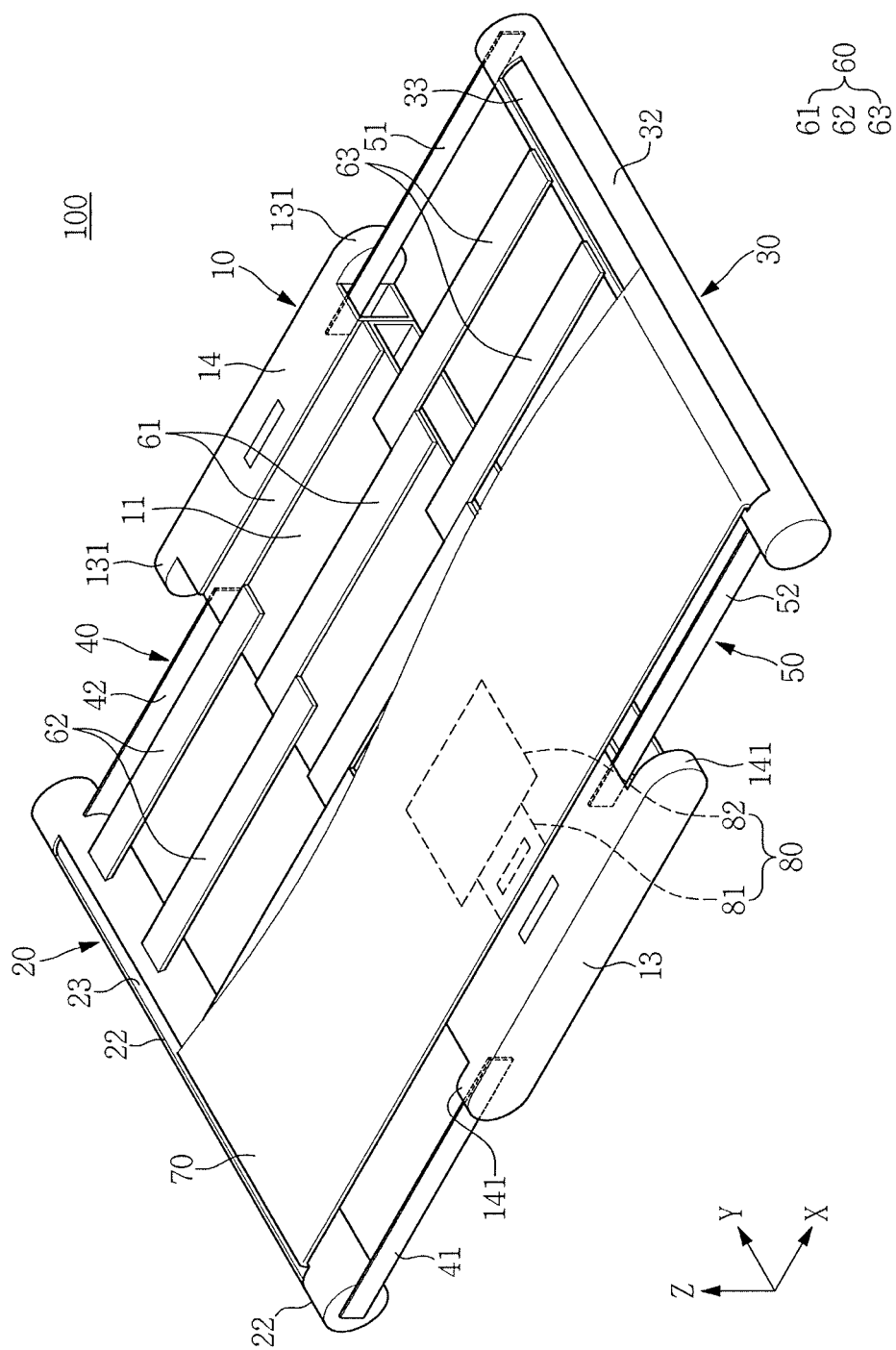
FIG. 2 is a perspective view illustrating an expanded structure of a flexible display device of FIG. 1 according to an exemplary embodiment of the present invention.
Figure 3:
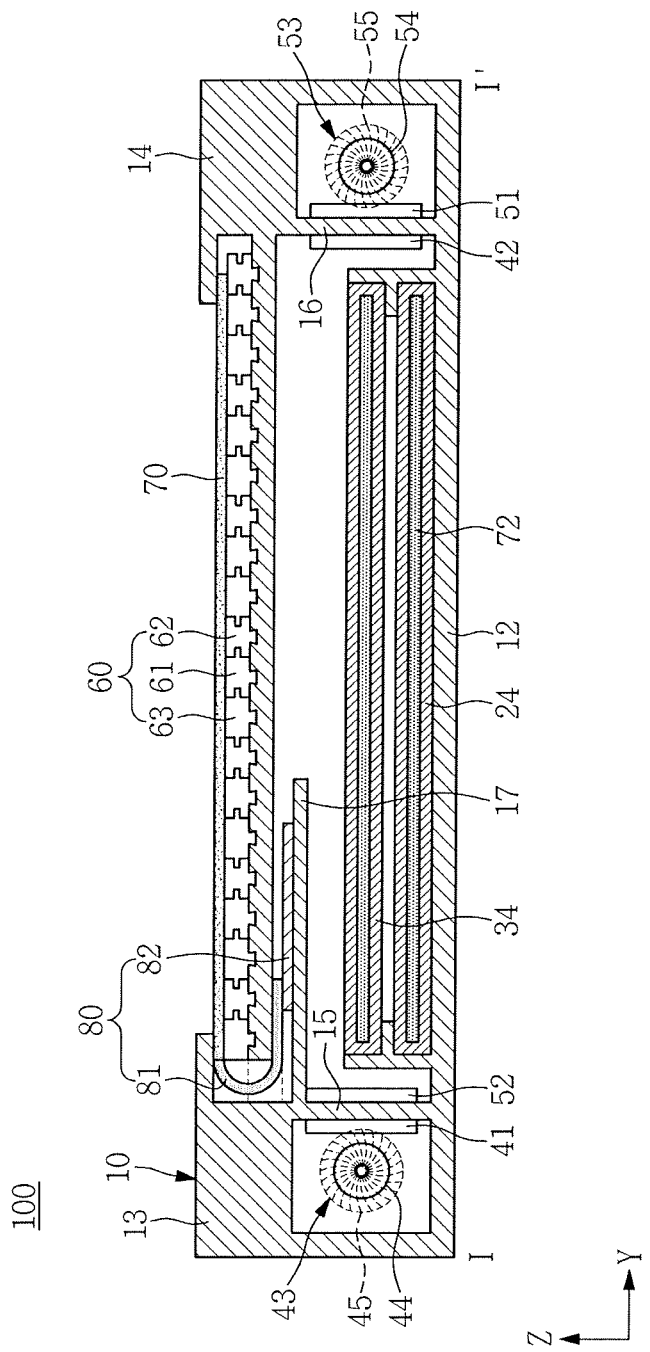
FIG. 3 is a cross-sectional view taken along a line I-I' of FIG. 1 according to an exemplary embodiment of the present invention.
Figure 4:
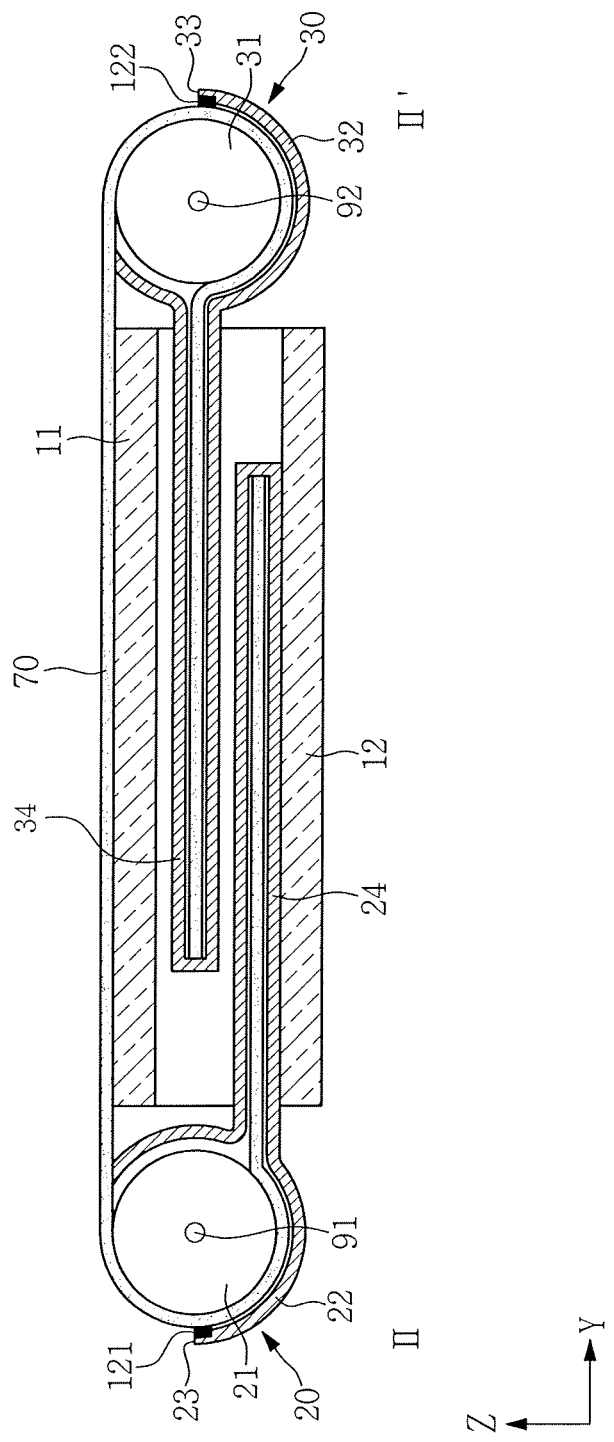
FIG. 4 is a cross-sectional view taken along a line II-II' of FIG. 1 according to an exemplary embodiment of the present invention.

FIG. 1 is a perspective view illustrating a flexible display device according to an exemplary embodiment of the present invention. FIG. 2 is a perspective view illustrating an expanded structure of a flexible display device of FIG. 1 according to an exemplary embodiment of the present invention. FIG. 3 is a cross-sectional view taken along a line I-I' of FIG. 1 according to an exemplary embodiment of the present invention. FIG. 4 is a cross-sectional view taken along a line II-II' of FIG. 1 according to an exemplary embodiment of the present invention.

Referring to FIGS. 1 to 4, a flexible display device 100 may include a housing 10, a first roller unit 20, a second roller unit 30, a first sliding unit 40, a second sliding unit 50, a rail unit 60, and a touch display panel 70. The touch display panel 70 may be a flexible touch display panel. The flexible touch display panel may be bent or rolled.

Referring to FIGS. 2 and 3, the housing 10 may include a support plate 11, an auxiliary support plate 12, a first accommodating portion 13, and a second accommodating portion 14. The housing 10 and the auxiliary support plate 12 may face each other, e.g., along a Z-axis direction. The first accommodating portion 13 may be connected to a first side of each of the support plate 11 and the auxiliary support plate 12. The second accommodating portion 14 may be connected to a second side of each of the support plate 11 and the auxiliary support plate 12. The support plate 11 may be an upper support plate. The auxiliary support plate 12 may be a lower support plate.

The first accommodating portion 13 and the second accommodating portion 14 may face each other, e.g., along a Y-axis direction. The first accommodating portion 13 and the second accommodating portion 14 may each include an inner space. The inner space of the first accommodating portion 13 and the second accommodating portion 14 may be configured to receive a first motor 44 and a second motor 54, respectively. Protrusions 141 may be positioned at opposite ends of the first accommodating portion 13, e.g., along an X-axis direction. Protrusions 131 may be positioned at opposite ends of the second accommodating portion 14, e.g., along the X-axis direction. The protrusions 131 and 141 may have a semi-cylindrical shape.

The X-axis direction may be a first surface direction of the flexible display device 100. The first surface of the flexible display device 100 may be expandable. The Y-axis direction may be a second surface direction of the flexible display device 100. The second surface direction may cross the first surface direction. The Z-axis direction may be a thickness direction of the flexible display device 100. The flexible display device 100 may be expandable in the thickness direction. The X-axis direction may be a substantially horizontal direction. The Y-axis direction may be a substantially vertical direction.

Referring to FIG. 4, the first roller unit 20 may be disposed at a first side of each of the support plate 11 and the auxiliary support plate 12. The second roller unit 30 may be disposed at a second side of each of the support plate 11 and the auxiliary support plate 12. The first roller unit 20 and the second roller unit 30 may face each other, e.g., along the X-axis direction. The first roller unit 20 may include a first roller 21 and a first roller housing 22. The first roller housing 22 may enclose the first roller 21. For example, the first roller housing 22 may partially enclose the first roller 21. The second roller unit 30 may include a second roller 31 and a second roller housing 32. The second roller housing 32 may enclose the second roller 31. For example, the second roller housing 32 may partially enclose the second roller 31.

Axial directions of each of the first roller 21 and the second roller 31 may be substantially parallel to the Y-axis direction. The first roller housing 22 and the second roller housing 32 may each have a cylindrical shape and have closed opposite ends.

The first roller 21 may be rotatably mounted inside the first roller housing 22, for example, by a bearing. The second roller 31 may be rotatably mounted inside the second roller housing 32, for example, by a bearing.

The first roller housing 22 may have a first opening 23. The first opening 23 may be substantially parallel to a central axis 91 of the first roller 21. The second roller housing 32 may have a second opening 33. The second opening 23 may be substantially parallel to a central axis 92 of the second roller 31. Portions of the touch display panel 70 may be drawn into each of the first roller housing 22 and the second roller housing 32 through the first opening 23 and the second opening 33 and may contact the first roller 21 and the second roller 31, respectively.

The first roller 21 and the second roller 31 may each be coated with an adhesive layer. The adhesive layer may have a relatively weak adhesiveness. The adhesive layer may contact the touch display panel 70. In a contracted mode of the flexible display device of FIG. 1, opposite ends of each of the first roller housing 22 and the second roller housing 32 may face corresponding protrusions 131 and 141 that face corresponding opposite ends along the Y-axis direction. The first roller 21 and the second roller 31 may have substantially the same diameter. A distance between the support plate 11 and the auxiliary support plate 12 may be substantially equal to the diameter of each of the first roller 21 and the second roller 31.

The first roller unit 20 may be affixed to the housing 10, for example, by the first sliding unit 40. The first roller unit 20 may move by driving of the first sliding unit 40, for example, such that a distance with respect to each of the support plate 11 and the auxiliary support plate 12 changes. Referring to FIG. 3, the first sliding unit 40 may include a pair of first sliders 41 and 42 and a first actuator 43. The pair of first sliders 41 and 42 may be affixed to opposite ends of the first roller housing 22. The first actuator 43 may be affixed to one of the pair of first sliders 41 and 42. For example, the first actuator 43 may be affixed to a first slider 41, which may allow the first slider 41 to move.

The second roller unit 30 may be affixed to the housing 10, for example, by the second sliding unit 50. The second roller unit 30 may move by driving of the second sliding unit 50, for example, such that a distance with respect to each of the support plate 11 and the auxiliary support plate 12 changes. Referring to FIG. 3, the second sliding unit 50 may include a pair of second sliders 51 and 52 and a second actuator 53. The pair of second sliders 51 and 52 may be affixed to opposite ends of the second roller housing 32. The second actuator 53 may be affixed to one of the pair of second sliders 51 and 52. For example, the second actuator 53 may be affixed to a second slider 51, which may allow the second slider 51 to move.

Figure 5:
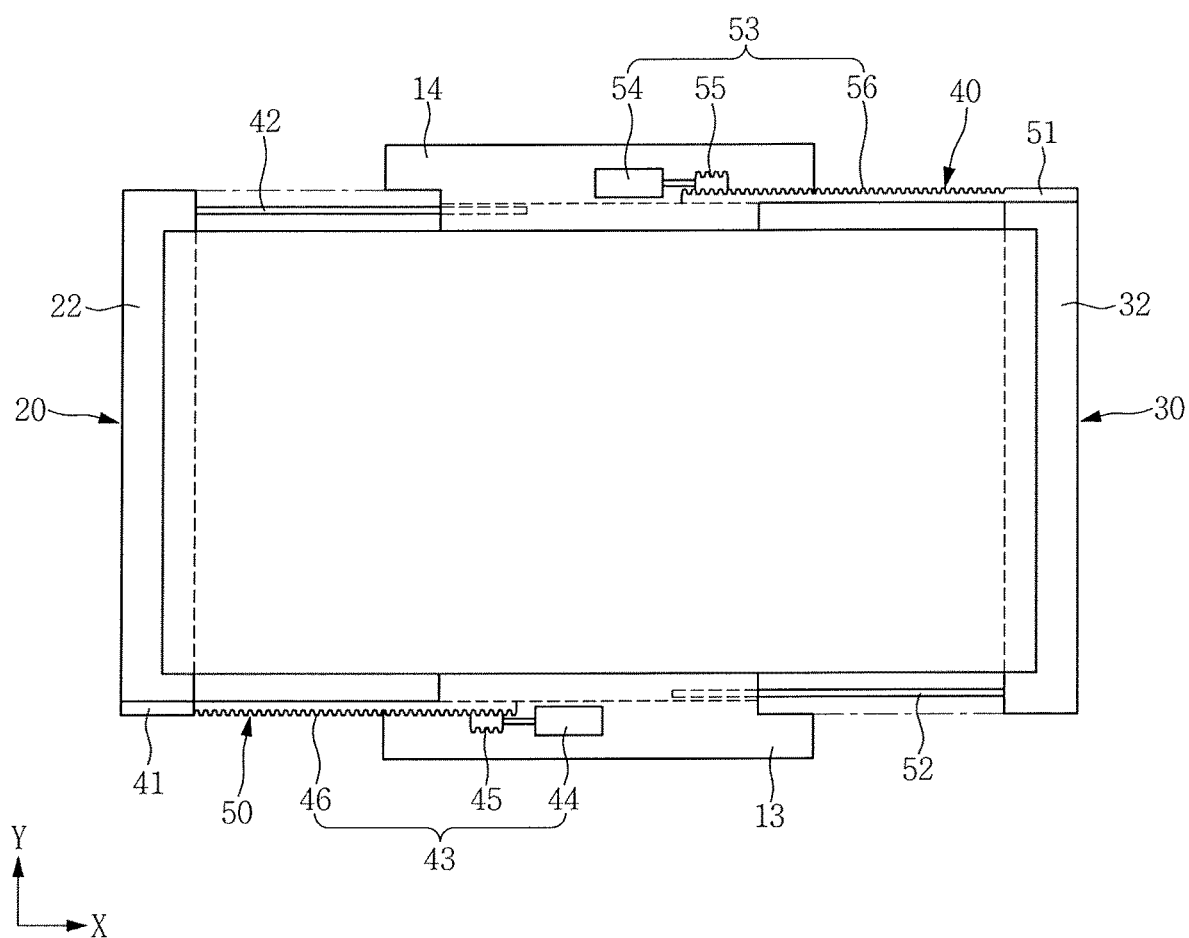
FIG. 5 is a plan view illustrating an expanded structure of a flexible display device of FIG. 2 according to an exemplary embodiment of the present invention.

FIG. 5 is a plan view illustrating an expanded structure of a flexible display device of FIG. 2 according to an exemplary embodiment of the present invention.

Referring to FIGS. 1 to 5, the pair of first sliders 41 and 42 may each have a bar shape. The pair of first sliders 41 and 42 may be substantially parallel to the X-axis direction. The pair of first sliders 41 and 42 may face each other, for example, along the Y-axis direction. The pair of second sliders 51 and 52 may each have a bar shape. The pair of second sliders 51 and 52 may each be substantially parallel to the X-axis direction. The pair of second sliders 51 and 52 may face each other along the Y-axis direction. Thickness directions of each of the pair of first sliders 41 and 42 and the pair of second sliders 51 and 52 may be in the Y-axis direction.

The first sliders 41 and 42 may include a first driving slider 41 and a first driven slider 42. The first driving slider 41 may be disposed on the same side of the flexible display apparatus 100 as the first accommodating portion 13. The first driver slider 42 may be disposed on the same side of the flexible display device 100 as the second accommodating portion 14. The pair of second sliders 51 and 52 may include a second driving slider 51 and a second driven slider 52. The second driving slider 51 may be disposed on the same side of the flexible display device 100 as the second accommodating portion 14. The second driven slider 52 may be disposed on the same side of the flexible display device 100 as the first accommodating portion 13.

The first driving slider 41 may be positioned outside the second driven slider 52. As a result, the first driving slider 41 might not contact the second driven slider 52. The second driving slider 51 may be positioned outside the first driven slider 42. As a result, the second driving slider 51 might not contact the first driven slider 42. A first guide wall 15 may be disposed between the first driving slider 41 and the second driven slider 52. A second guide wall 16 may be disposed between the second driving slider 51 and the first driven slider 42.

The first guide wall 15 may be a wall dividing a space between the support plate 11 and the auxiliary support plate 12 from an inner space of the first accommodating portion 13. The first guide wall 15 may be configured to guide movement of each of the first driving slider 41 and the second driven slider 52. The second guide wall 16 may be a wall dividing a space between the support plate 11 and the auxiliary support plate 12 from an inner space of the second accommodating portion 14. The second guide wall 16 may be configured to guide movement of each of the second driving slider 51 and the first driven slider 42. The pair of first sliders 41 and 42 and the pair of second sliders 51 and 52 may be positioned at substantially a same height from a lowermost end of the housing 10.

The first actuator 43 may include a first motor 44, a first rack gear 45, and a first pinion gear 46. The first motor 44 may be affixed to the first accommodating portion 13. The first rack gear 45 may be affixed to the first motor 44. The first pinion gear 46 may be disposed on a surface of the first driving slider 41. The first pinion gear 46 may be engaged with the first rack gear 45. The second actuator 53 may include the second motor 54. The second motor 54 may be affixed to the second accommodating portion 14. The second rack gear 55 may be affixed to the second motor 54. The second pinion gear 56 may be disposed on a surface of the second driving slider 51. The second pinion gear 56 may be engaged with the second rack gear 55.

When the first rack gear 45 rotates by driving of the first motor 44, the first driving slider 41 may move in the X-axis direction. As a result, the first roller unit 20 may move. The position of the first roller unit 20 may be determined, for example, according to a rotation direction and a rotation amount of the first motor 44. When the second rack gear 55 rotates by driving of the second motor 54, the second driving slider 51 may move in the X-axis direction. As a result, the second roller unit 30 may move. The position of the second roller unit 30 may be determined, for example, according to a rotation direction and a rotation amount of the second motor 54.

The first sliding unit 40 and the second sliding unit 50 may each include a motor as a power source and a rack gear and the pinion gear as a power transmitting apparatus; however, configurations of the first sliding unit 40 and the second sliding unit 50 are not limited thereto. For example, a power source other than a motor may be used and a power transmission apparatus other than a rack gear and a pinion gear may be used.

Referring to FIGS. 1 to 4, the rail unit 60 may support the touch display panel 70. The rail unit 60 may be disposed on each of the support plate 11, the first roller unit 20 and the second roller unit 30.

The rail unit 60 may include a plurality of fixed rails 61, a plurality of first moving rails 62, and a plurality of second moving rails 63. The plurality of first moving rails 62 may be affixed to the support plate 11. The plurality of first moving rails 62 may be affixed to the first roller unit 20. The plurality of first moving rails 62 may be engaged with a first side surface of the plurality of fixed rails 61. The plurality of second moving rails 63 may be affixed to the second roller unit 30. The plurality of second moving rails 63 may be engaged with a second side surface of the plurality of fixed rails 61. Each of the plurality of fixed rails 61, the plurality of first moving rails 62, and the plurality of second moving rails 63 may include a band-shaped rail. The band-shaped rail may be substantially parallel to the X-axis direction. The band-shaped rail may include a metal.

The plurality of fixed rails 61 may be disposed on the support plate 11, for example, along the Y-axis direction. The plurality of fixed rails 61 may be spaced apart from each other. The plurality of first moving rails 62 may be affixed to the first roller housing 22. The plurality of first moving rails 62 may be affixed to the first roller housing 22, for example, along the Y-axis direction. The plurality of first moving rails 62 may be spaced apart from each other. The plurality of second moving rails 63 may be affixed to the second roller housing 32, for example, along the Y-axis direction. The plurality of second moving rails 63 may be spaced apart from each other.

The first moving rail 62 and the second moving rail 63 may each be disposed between adjacent fixed rails 61, for example, along the Y-axis direction. Thus, a side surface of the first moving rail 62 may be engaged with a side surface of the second moving rail 63. The fixed rail 61, the first moving rail 62 and the second moving rail 63 may be repeatedly arranged along the Y-axis direction in the order of the fixed rail 61, the first moving rail 62, and the second moving rail 63; however, exemplary embodiments of the present invention are not limited thereto.

Side surfaces of each of the plurality of fixed rails 61, the plurality of first moving rails 62 and the plurality of second moving rails 63 may be engaged with each other, for example, in a projection-groove engagement structure.

For example, each of the plurality of first moving rails 62 may include first grooves. The first grooves may be defined on opposite side surfaces of the plurality of first moving rails 62. Each of the plurality of second moving rails 63 may include first projections. The first projections may be formed on opposite side surfaces of the plurality of second moving rails 63. Each of the plurality of fixed rails 61 may include a second projection and a second groove. The second projection may be formed on a first side surface of the plurality of fixing rails 61. The second projection may face the first moving rail 62. The second groove defined on a second side surface of the plurality of fixing rails 61. The second groove may face the second moving rail 63.

Each of the plurality of fixed rails 61, the plurality of first moving rails 62, and the plurality of second moving rails 63 may include a third projection. The third projection may be formed on a lower surface of each of the plurality of fixing rails 61, the plurality of first moving rails 62, and the plurality of second moving rails 63. The support plate 11 may be defined with a plurality of third grooves. The plurality of third grooves may respectively receive the plurality of third projections. The plurality of first moving rails 62 and the plurality of second moving rails 63 may each slide, for example, in the X-axis direction with respect to the support plate 11.

Referring to FIGS. 1 to 4, in the contracted mode, the plurality of first moving rails 62 and the plurality of second moving rails 63 may be positioned above the support plate 11. Thus, the plurality of first moving rails 62 and the plurality of second moving rails 63 may each be substantially parallel to the plurality of fixed rails 61. In an expanded mode, the plurality of first moving rails 62 and the first roller unit 20 may each slide, for example, to expand in a positive (+) X direction with respect to the support plate 11. The plurality of second moving rails 63 and the second roller unit 30 may each slide, for example, to expand in a negative (−) X direction with respect to the support plate 11.

A length of each of the plurality of first moving rails 62 may be greater than a maximum sliding distance of the first roller housing 22. As a result, the plurality of first moving rails 62 might not be completely separated from the plurality of fixed rails 61 in the expanded mode. A length of each of the plurality of second moving rails 63 may be greater than a maximum sliding distance of the second roller housing 32. As a result, the plurality of second moving rails 63 might not be completely separated from the plurality of fixed rails 61 in the expanded mode.

The rail unit 60 may support the touch display panel 70. The plurality of first moving rails 62 and the plurality of second moving rails 63 may each support the touch display panel 70 in the expanded mode.

The touch display panel 70 may covers a surface of the rail unit 60. For example, the touch display panel 70 may cover an upper surface of the rail unit 60. A central portion of the touch display panel 70 may be affixed to the plurality of fixed rails 61. A first outer side portion of the central portion may be affixed to the first roller unit 20. A second outer side portion of the central portion may be affixed to the second roller unit 30. Exposed areas of each of the outer side portions of the central portion affixed to the first roller unit 20 and the second roller unit 30 may vary.

Referring to FIGS. 3 and 4, the first roller unit 20 may include a first guide portion 24. The first guide portion 24 may support each of a first variable display portion 72 and a first dummy portion 74. The first guide portion 24 may also guide a sliding of each of the first variable display portion 72 and the first dummy portion 74. The first guide portion 24 may be affixed to the first roller housing 22, for example, behind the support plate 11. The first guide portion 24 may define an inner space, which may be open toward the first roller 21. The first guide portion 24 may be configured to receive each of the first variable display portion 72 and the first dummy portion 74 in the inner space.

The second roller unit 30 may include a second guide portion 34. The second guide portion 34 may support each of a second variable display portion 73 and a second dummy portion 75. The second guide portion 34 may also guide a sliding of each of the second variable display portion 73 and the second dummy portion 75. The second guide portion 34 may be affixed to the second roller housing 32, for example, behind the support plate 11. The second guide portion 34 may define an inner space, which may be open toward the second roller 31. The second guide portion 34 may be configured to receive each of the second variable display portion 73 and the second dummy portion 75 in the inner space. The first guide portion 24 and the second guide portion 34 may overlap each other, for example, above the auxiliary support plate 12.

Referring to FIG. 4, the touch display panel 70 may contact each of the first roller housing 22 and the second roller housing 32; however, the first roller housing 22 and the second roller housing 32 may each secure a space between the touch display panel 70 and the first roller housing 22 and between the touch display panel 70 and the second roller housing 32, respectively. As a result, movement of the touch display panel 70 might not be restricted.

Referring to FIGS. 1 to 3, the flexible display device 100 may include a driving module unit 80. The driving module unit 80 may include a flexible printed circuit board ("FPCB") 81 and a printed circuit board ("PCB") 82. The FPCB 81 may be a chip on film ("COF") circuit board. The PCB 82 may be connected to the FPCB 81. The FPCB 81 may be affixed to a side of a fixed display portion 71. The FPCB 81 may be folded about 180 degrees. As a result, the FPCB 81 may be positioned behind the fixed display portion 71. The PCB 82 may also be positioned behind the fixed display portion 71.

The driving module unit 80 may be connected to the first dummy portion 74 or the second dummy portion 75. The driving module unit 80 may slide with the first dummy portion 74 or the second dummy portion 75. As a result, the driving module unit 80 may be relatively easily damaged.

Since the affixed display portion 71 is a portion that might not slide, the driving module unit 80 connected to the fixed display portion 71 may substantially minimize damage to the driving module unit 80. A module support plate 17 may be disposed between the support plate 11 and the auxiliary support plate 12. The module support plate 17 may support the driving module unit 80. Thus, the flexible display device 100, which may be expandable, may reduce or prevent the driving module unit 80 from being damaged due to sliding by connecting the driving module unit 80 to the fixed display portion 71.

Figure 6:
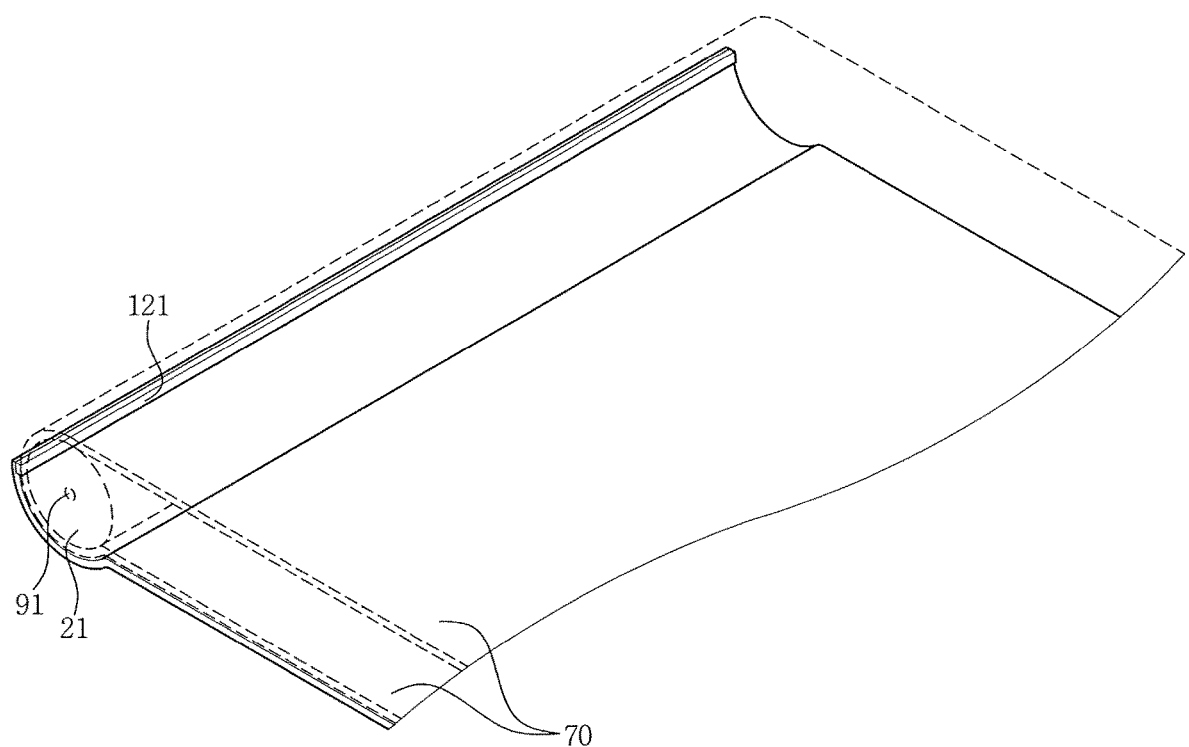
FIG. 6 is a configuration view illustrating a first touch bar of FIG. 4 according to an exemplary embodiment of the present invention.

FIG. 6 is a configuration view illustrating a touch bar of FIG. 4 according to an exemplary embodiment of the present invention.

Referring to FIG. 6, the first touch bar 121 may have a long bar shape. For example, the first touch bar 121 may have a relatively straight linear shape. The relatively straight linear shape may be substantially parallel to the central axis 91 of the first roller 21 or the central axis 92 of the second roller 31.

Referring to FIGS. 4 and 6, the first touch bar 121 may be disposed between the first roller housing 22 and the touch display panel 70. For example, the first touch bar 121 may be disposed inside the first roller housing 22. The first touch bar 121 may protrude from an inner side surface of the first roller housing 22, for example, toward an outer circumferential surface of the first roller 21. As a result, the first touch bar 121 may contact a portion of the touch display panel 70 rolled around the outer circumferential surface of the first roller 21. Thus, the first touch bar 121 may contact a portion of the touch display panel 70 between the first touch bar 121 and the first roller 21. The first touch bar 121 may contact a display portion of the touch display panel 70.

The first touch bar 121 may cross the touch display panel 70. For example, the first touch bar 121 may cross the display portion of the touch display panel 70. Accordingly, the first touch bar 121 may cross facing sides of the touch display panel 70. Thus, the first touch bar 121 may cross facing sides among sides defining the display portion of the touch display panel 70. The facing sides may refer to sides having a curved shape, for example, while being rolled around the first roller 21.

A second touch bar 122 may have a long bar shape. Thus, the second touch bar 122 may have a similar shape as the first touch bar 121. For example, the second touch bar 122 may have a relatively straight linear shape. The relatively straight linear shape may be substantially parallel to the central axis 91 of the first roller 21 or the central axis 92 of the second roller 31.

Referring to FIG. 4, the second touch bar 122 may be disposed between the second roller housing 32 and the touch display panel 70. For example, the second touch bar 122 may be disposed inside the second roller housing 32. The second touch bar 122 may protrude from an inner side surface of the second roller housing 32, for example, toward an outer circumferential surface of the second roller 31. As a result, the second touch bar 122 may contact a portion of the touch display panel 70 rolled around the outer circumferential surface of the second roller 31. Thus, the second touch bar 122 may contact a portion of the touch display panel 70 between the second touch bar 122 and the second roller 31. The second touch bar 122 may contact the display portion of the touch display panel 70.

The second touch bar 122 may cross the touch display panel 70. For example, the second touch bar 122 may cross the display portion of the touch display panel 70. Accordingly, the second touch bar 122 may cross facing sides of the touch display panel 70. Thus, the second touch bar 122 may cross facing sides among sides defining the display portion of the touch display panel 70. The facing sides may refer to sides having a curved shape while being rolled around the second roller 31.

Figure 7:
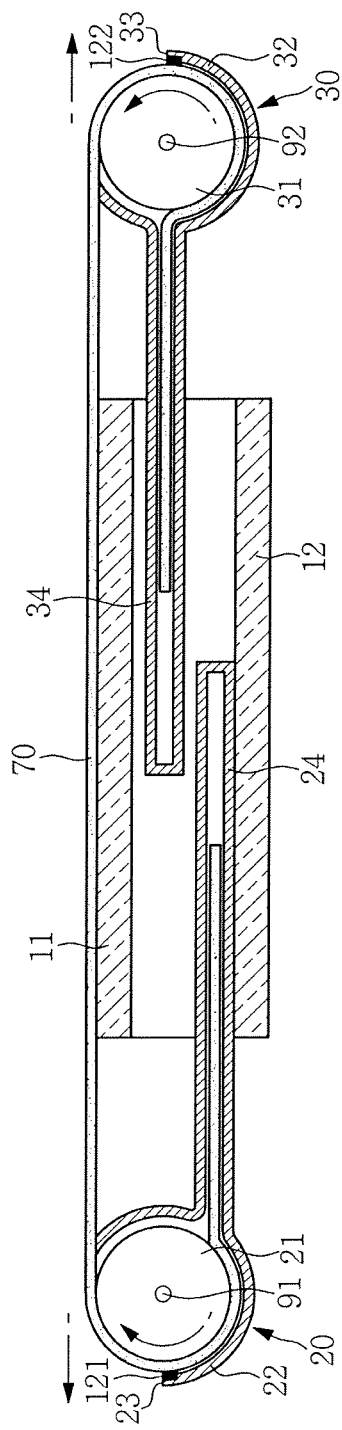
FIG. 7 is a cross-sectional view illustrating an expanded structure of a flexible display device of FIG. 2 according to an exemplary embodiment of the present invention.

FIG. 7 is a cross-sectional view illustrating an expanded structure of a flexible display device of FIG. 2 according to an exemplary embodiment of the present invention.

Referring to FIG. 7, when the first roller housing 22 and the second roller housing 32 are pulled in directions away from each other, respectively, the first roller 21 of the first roller housing 22 and the second roller 31 of the second roller housing 32 may rotate in opposite directions, respectively. Thus, the first roller 21 may rotate in a clockwise direction. The second roller 31 may rotate in a counterclockwise direction. By the rotation of the first and second rollers 21 and 31, a portion of the touch display panel 70 located at the first roller housing 22 may be exposed through the first opening 23, and a portion of the touch display panel 70 located at the second roller housing 32 may be exposed through the second opening 33.

When the first roller housing 22 and the second roller housing 32 are pushed to come close to each other, the first roller 21 may rotate in the counterclockwise direction and the second roller 31 may rotate in the clockwise direction. Accordingly, opposite end portions of the touch display panel 70 are inserted into the first roller housing 22 and the second roller housing 32, respectively.

Figure 8:
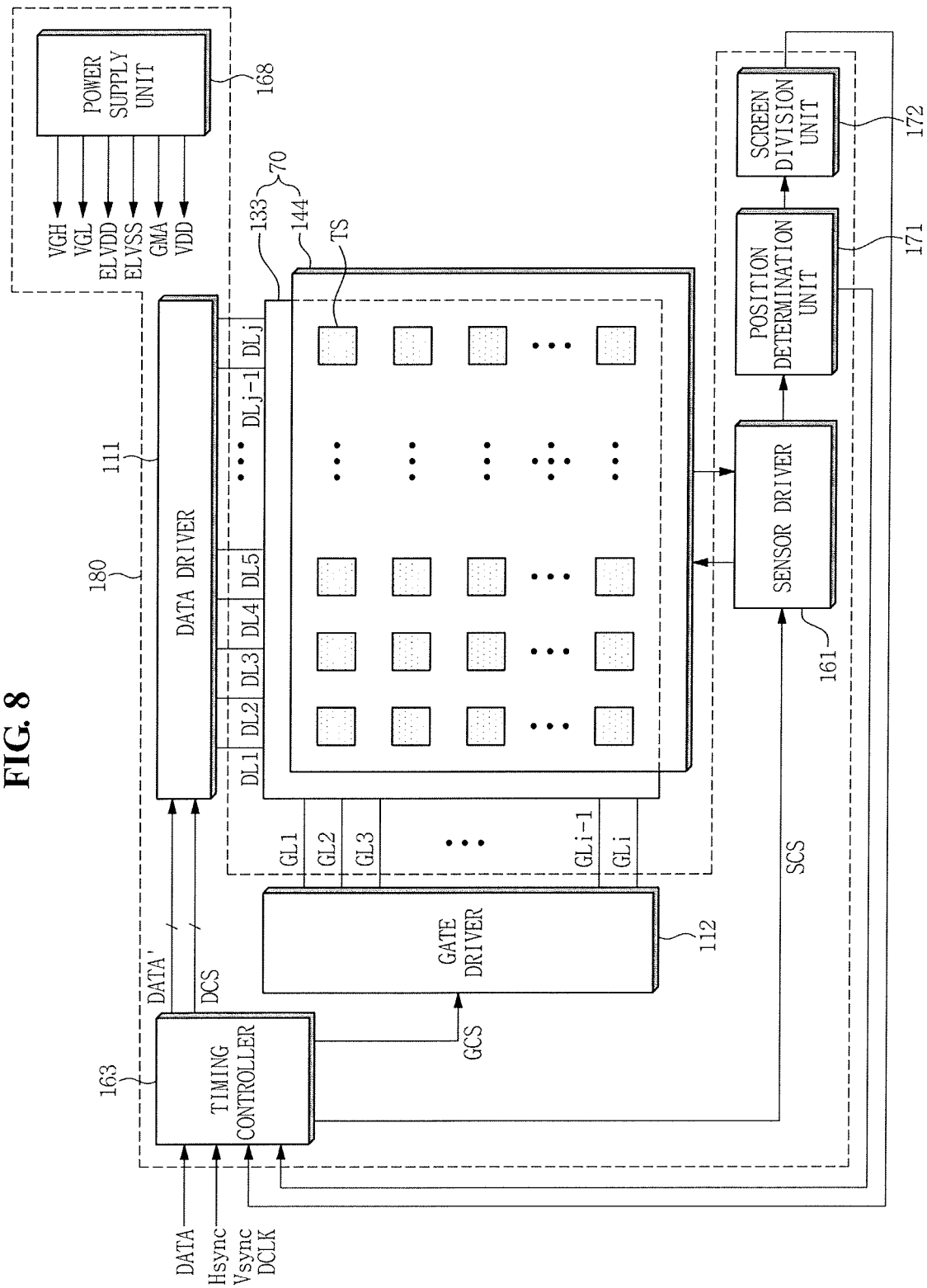
FIG. 8 is a configuration view illustrating a touch display panel and a panel driver of FIG. 1 according to an exemplary embodiment of the present invention.
Figure 9:
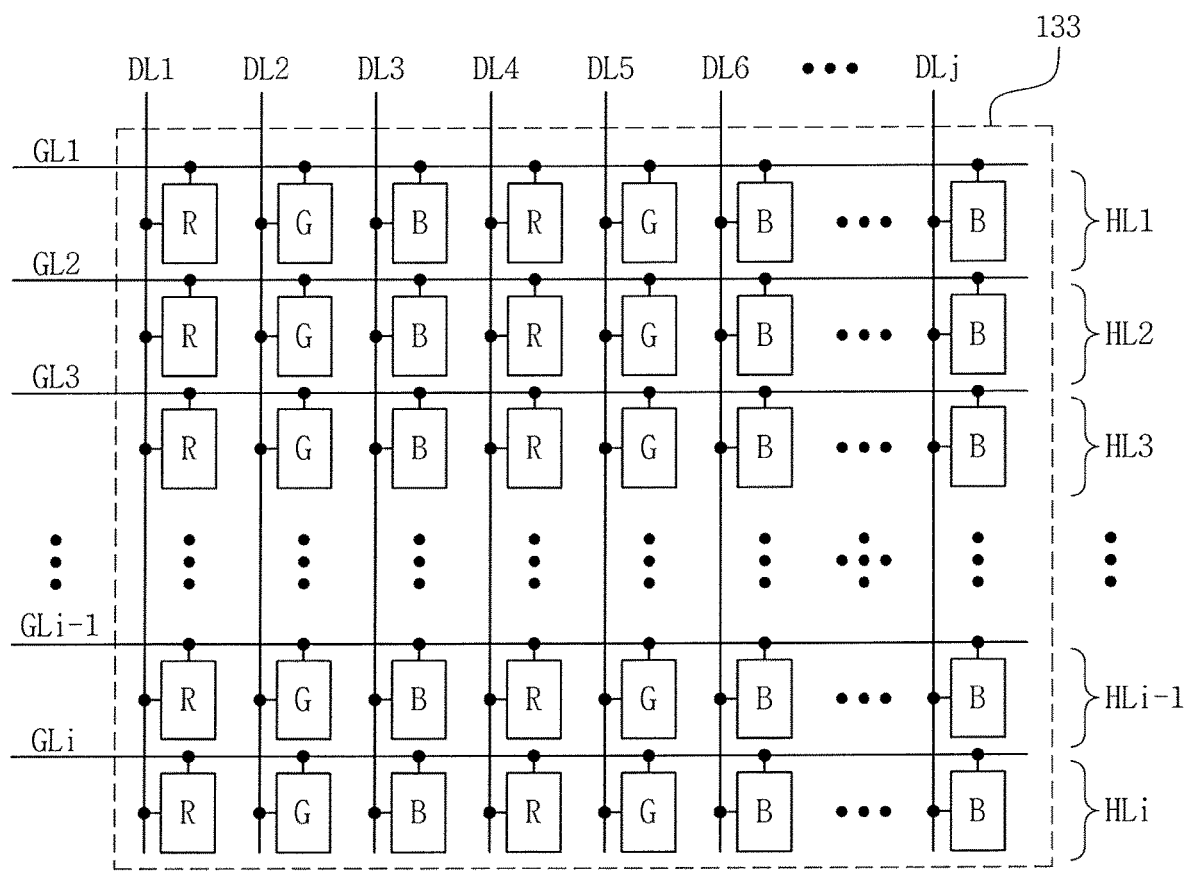
FIG. 9 is a configuration view illustrating a display panel of FIG. 8 according to an exemplary embodiment of the present invention.

FIG. 8 is a configuration view illustrating a touch display panel and a panel driver of FIG. 1 according to an exemplary embodiment of the present invention. FIG. 9 is a configuration view illustrating a display panel of FIG. 8 according to an exemplary embodiment of the present invention.

Referring to FIG. 8, the touch display panel 70 may include a display panel 133 and a touch panel 144.

The display panel 133 may include i*j number of pixels R, G and B, i number of gate lines GL1 to GLi, and j number of data lines DL1 to DLj. j may be a natural number greater than 1.

First to i-th gate signals may be applied to the first to i-th gate lines GL1 to SLi, respectively. First to j-th data image data signals may be applied to the first to j-th data lines DL1 to DLj, respectively.

According to an exemplary embodiment of the present invention, the display panel 133 may include a relatively high electric potential power line and a relatively low electric potential power line. The relatively high electric potential power line may supply a relatively high electric potential driving voltage ELVDD to the i*j number of pixels R, G and B. The relatively low electric potential power line may supply a relatively low electric potential driving voltage ELVSS to the i*j number of pixels R, G and B.

Referring to FIG. 2, the pixels R, G and B may be arranged on a display portion of the display panel 133, for example, in the form of a matrix. These pixels R, G and B may include red pixels R representing a red color, green pixels G representing a green color, and blue pixels B representing a blue color. A red pixel R, a green pixel G, and a blue pixel B may be adjacently disposed in a horizontal direction and may define a unit pixel. The unit pixel may display a unit image.

"j" number of pixels may be arranged along an x-th horizontal line (x-th horizontal line pixels). x may be a number selected from 1 to i. The x-th horizontal line pixels may be respectively connected to the first to j-th data lines DL1 to DLj. The x-th horizontal line pixels may be connected to an x-th gate line in common. Accordingly, the x-th horizontal line pixels may receive an x-th gate signal as a common signal. Thus, "j" number of pixels arranged in substantially a same horizontal line may receive substantially a same gate signal. Pixels arranged in different horizontal lines may receive different gate signals, respectively. For example, each of a red pixel R, a green pixel G and a blue pixel B arranged on a first horizontal line HL1 may receive a first gate signal output. A red pixel R, a green pixel G and a blue pixel B arranged on a second horizontal line HL2 may receive a second gate signal output, for example, at a different timing from a timing of the first gate signal output.

The touch panel 144 may include a plurality of touch sensing elements TS. The plurality of touch sensing elements TS may be disposed on the touch panel 144. One touch sensing element TS may be provided for q number of pixels. q may be a natural number. The touch panel 144 may be positioned above or below the display panel 133.

The touch sensing element TS may sense a touch when the touch is applied to the touch sensing element TS. As a result, the touch sensing element TS may generate a touch sensing signal.

According to an exemplary embodiment of the present invention, the display panel 133 may provide a display function and a function of the touch panel 144 omitting the separate touch panel 144. The touch sensing element TS and elements for driving the touch sensing element TS may be embedded in the display panel 133.

The panel driver 180 may divide the display portion of the touch display panel 70, for example, into a display area and a non-display area. The panel driver 180 may divide the display portion of the touch display panel 70 according to positions of touch sensing elements TS contacting each of the first touch bar 121 and the second touch bar 122. The panel driver 180 may receive touch sensing signals generated from the touch sensing element TS contacting each of the first touch bar 121 and the second touch bar 122. According to the touch sensing signals, the panel driver 180 may detect positions of the touch sensing elements TS contacting the first touch bar 121 and positions of the touch sensing elements TS contacting the second touch bar 122.

Since the first touch bar 121 may have a substantially straight bar shape crossing the touch display panel 70, touch sensing elements TS contacting the first touch bar 121 may be arranged in a line along the first touch bar 121. Since the second touch bar 122 may have a substantially straight bar shape crossing the touch display panel 70, touch sensing elements TS contacting the second touch bar 122 may be arranged in a line along the second touch bar 122.

According to an exemplary embodiment of the present invention, some of the touch sensing elements TS in a column contacting the first touch bar 121 might not substantially contact the first touch bar 121. Thus, due to characteristics of the touch display panel 70 which may be easily bent or due to incomplete flatness of a contact surface of the first touch bar 121 contacting the touch display panel 70, some of the touch sensing elements TS in the column might not substantially contact the first touch bar 121. A touch sensing signal might not be generated from a touch sensing element that does not substantially contact the first touch bar 12. Thus, when about 80% or more of the total number of touch sensing elements TS in the column overlapping the first touch bar 121 generate touch sensing signals, the panel driver 180 may determine the touch sensing elements TS in the column are substantially in contact with the first touch bar 121. The panel driver 180 may determine that substantially all of the touch sensing elements TS in the column are touched by the first touch bar 121. Thus, the panel driver 180 may determine that each of the touch sensing elements TS in the column may generate a touch sensing signal. If a value corresponding to a number of about 80% or more of the total number of touch sensing elements TS in the column is not a natural number, a portion below the decimal point may be rounded down. Alternatively, whether or not a contact is made may be determined by a majority rule as a threshold.

Some of touch sensing elements TS in the column contacting the second touch bar 122 might not substantially contact the second touch bar 122. Thus, when about 80% or more of the total number of touch sensing elements TS in the column overlapping the second touch bar 122 generate touch sensing signals, the panel driver 180 may determine that the touch sensing elements TS in the column are substantially in contact with the second touch bar 122.

A touch sensing element TS substantially contacting the first touch bar 121 may be referred to as a first active touch sensing element. A touch sensing element TS substantially contacting the second touch bar 122 may be referred to as a second active touch sensing element.

The panel driver 180 may detect positions of the first active touch sensing elements in the touch display panel 70 and may detect positions of the second active touch sensing elements in the touch display panel 70. Thus, the panel driver 180 may detects positions of each of the first active touch sensing elements and the second active touch sensing elements in the display portion. The position of the first active touch sensing element may refer to a position of the first active touch sensing element in the display portion of the touch display panel 70. The position of the second active touch sensing element may refer to a position of the second active touch sensing element in the display portion of the touch display panel 70.

The panel driver 180 may divide the display portion of the touch display panel 70 into a display area and a non-display area. The panel driver 180 may divide the display portion of the touch display panel 70 into the display area and the non-display area according to positions of the first active touch sensing elements and the positions of the second active touch sensing elements. The panel driver 180 may provide a first touch line TL. The first touch line TL1 may pass through at least two first active touch sensing elements. The panel driver 80 may also provide a second touch line TL2. The second touch line TL2 may pass through at least two second active touch sensing elements. Thus, the panel driver 180 may assume several touch points between adjacent first active touch sensing elements. The panel driver 180 may also assume several touch points between adjacent second active touch sensing elements. The first touch line TL1 may cross the display portion. Accordingly, the first touch line TL1 may cross facing sides among the sides defining the display portion. The second touch line TL2 may cross the display portion. Accordingly, the second touch line TL2 may cross facing sides among the sides defining the display portion. The facing sides of the display portion may refer to sides having a curved shape, for example, while being rolled around the first roller 21 or the second roller 31.

The panel driver 180 may divide the display portion of the touch display panel 70, for example, into a display area and a non-display area. The panel driver 180 may divide the display portion of the touch display panel 70 into a display area and a non-display area according to the first touch line TL1 and the second touch line TL2.

The panel driver 180 may activate at least a portion of the display area. The panel driver 180 may deactivate the non-display area. For example, the panel driver 180 may display an image in at least a portion of the display area. The panel driver 180 might not display an image in the non-display area. For example, the panel driver 180 may activate pixels in the display area. The panel driver 180 may deactivate pixels in the non-display area.

According to an exemplary embodiment of the present invention, the panel driver 180 may activate touch sensing elements TS in the display area. The panel driver 180 may deactivate touch sensing elements TS in the non-display area.

The panel driver 180 may include a sensor driver 161, a position determination unit 171, a screen division unit 172, a timing controller 163, a gate driver 112, a data driver 111, and a power supply unit 168.

The panel driver 180 may be positioned at the driving module unit 80. For example, the timing controller 163 and the power supply unit 168 may each be disposed on the PCB 82. The gate driver 112, the data driver 111, the sensor driver 161, the position determination unit 171 and the screen division unit 172 may each be disposed on the FPCB 81. For example, an integrated circuit ("IC") may be disposed on the FPCB 81. Each of the gate driver 112, the data driver 111, the sensor driver 161, the position determination unit 171, and the screen division unit 172 may be embedded in the IC.

The sensor driver 161 may drive the touch sensing elements TS of the touch display panel 70. The sensor driver 161 may read sensing results, i.e., touch sensing signals. The sensing results may be generated from the driven touch sensing element TS. The sensor driver 161 may generate a driving signal to drive the touch sensing elements TS. The driving signal may be a pulse supplied to the touch sensing elements TS.

The position determination unit 171 may detect positions of the first active touch sensing elements and positions of the second active touch sensing elements, for example, according to the touch sensing signals applied from the sensor driver 161. The position determination unit 171 may set the first touch line TL1 according to the positions of the first active touch sensing elements. The position determination unit 171 may set the second touch line TL2 according to the positions of the second active touch sensing elements. Thus, the position determination unit 171 may calculate coordinates of each of the first touch line TL1 and the second touch line TL2.

According to an exemplary embodiment of the present invention, when different touch sensing signals are further applied from the sensor driver 161, the position determination unit 171 may further detect coordinates of another touch point on the touch display panel 70 based on the touch sensing signals.

The screen division unit 172 may divide the display portion of the touch display panel 70, for example, into a display area and a non-display area. The screen division unit 172 may divide the display portion of the touch display panel 70 according to the positions of the first active touch sensing elements and the second active touch sensing elements. For example, the screen division unit 172 may divide the display portion of the touch display panel 70 into a display area and a non-display area according to the first touch line TL1 and the second touch line TL2.

The display portion of the touch display panel 70 may be divided into three areas. For example, the display portion of the touch display panel 70 may be divided into a first non-display area, a display area, and a second non-display area. The first non-display area may be positioned between the first touch line TL1 and a first end 991 of the touch display panel 70. The display area may be positioned between the first touch line TL1 and the second touch line TL2. The second non-display area may be positioned between the second touch line TL2 and a second end 992 of the touch display panel 70. The first end 991 of the touch display panel 70 may refer to an end of the touch display panel 70 disposed inside the first roller housing 22. The second end 992 of the touch display panel 70 may refer to an end of the touch display panel 70 disposed inside the second roller housing 32. Thus, the first end 991 may be positioned in the first guide portion 24 of FIG. 4. The second end 992 may be positioned in the second guide portion 34 of FIG. 4.

According to an exemplary embodiment of the present invention, when the first touch line TL1 detected for a predetermined amount of time may move toward the second end 992 of the touch display panel 70, the panel driver 180 may set an area between the detected first touch line TL1 and the first end 991 of the touch display panel 70. The area between the detected first touch line TL1 and the first end 991 of the touch display panel 70 may be the first non-display area. Thus, an erroneous touch line TL1 may be detected by an unintentional touch other than the first touch bar 121. To minimize such errors, the panel driver 180 may trace a movement direction of the first touch line TL1 for a predetermined time. When the first touch line TL1 is generated at at least two different positions during the predetermined time and the first touch line TL1 may move toward a specific direction during the predetermined time, the panel driver 180 may determine that the first touch line TL1 is a touch line that is generated in a normal manner by rotation (e.g., in the counterclockwise direction) of the first roller 21.

When the first touch line TL1 detected for a predetermined time may move toward the first end 991 of the touch display panel 70, the panel driver 180 may sets an area between the detected first touch line TL1 and the second touch line TL2. The area between the detected first touch line TL1 and the second touch line TL2 may be the display area.

According to an exemplary embodiment of the present invention, when the second touch line TL2 detected for a predetermined time may move toward the first end 991 of the touch display panel 70, the panel driver 180 may set an area between the detected second touch line TL2 and the second end 992 of the touch display panel 70. The area between the detected second touch line TL2 and the second end 992 of the touch display panel 70 may be the second non-display area. Thus, an erroneous touch line TL2 may be detected by an unintentional touch other than the second touch bar 122. To minimize such errors, the panel driver 180 may trace a movement direction of the second touch line TL2 for a predetermined time. When the second touch line TL2 is generated at at least two different positions during the predetermined time and the second touch line TL2 may move toward a specific direction during the predetermined time, the panel driver 180 may determine that the second touch line TL2 is a touch line that is generated in a normal manner by rotation (e.g., in the clockwise direction) of the second roller 31.

When the second touch line TL2 detected for a predetermined time may move toward the second end 992 of the touch display panel 70, the panel driver 180 may set an area between the detected second touch line TL2 and the first touch line TL1. The area between the detected second touch line TL2 and the first touch line TL1 may be the display area.

The timing controller 163 may correct image data signals DATA externally applied thereto. For example, the timing controller 163 may correct image data signals DATA according to touch related information provided from each of the position determination unit 171 and the screen division unit 172. The timing controller 163 may apply corrected image data signals DATA' to the data driver 111. The timing controller 163 may generate a gate control signal GCS, a data control signal DCS and a sensor control signal SCS, for example, by respectively using a horizontal synchronization signal Hsync, a vertical synchronization signal Vsync and a dot clock DCLK externally applied thereto. The data control signal DCS may be a control signal, for example, for controlling an operation of the data driver 111. The data control signal DCS may be applied to the data driver 111. The gate control signal GCS may be a signal for controlling the gate driver 112. The gate control signal GCS may be applied to the gate driver 112. The sensor control signal SCS may be a signal for controlling the sensor driver 161. The sensor control signal SCS may be applied to the sensor driver 161.

The gate driver 112 may drive the pixels on a horizontal line basis. For example, the gate driver 112 may drive the i*j number of pixels by each j number of pixels. Thus, the gate driver 112 may substantially simultaneously drive j number of pixels during a horizontal period. Accordingly, the gate driver 112 may output the first to i-th gate signals according to the gate control signal GCS applied from the timing controller 163. Thus, n-th horizontal line pixels may be controlled according to an n-th gate signal. The n-th gate signal may be a pulse. The pulse may keep an active state during an n-th horizontal period of each frame. The pulse may keep an inactive state during the remaining period of each frame. Substantially all of the i number of gate signals may be a pulse of substantially a same form; however, the i number of gate signals may have different output points in time. The active state of a signal including the gate signal may refer to a state in which a switching element applied with a signal having such a state may be turned ON. The inactive state of a signal including the gate signal may refer to a state in which a switching element applied with a signal having such a state may be turned OFF. For example, each of the first to i-th gate signals may have a voltage of about 20 [V] during the active state. During the inactive state, each of the first to i-th gate signals may have a voltage of about −5 [V].

The data driver 111 may sample the corrected image data signals DATA' according to the data control signal DCS applied from the timing controller 163. The data driver 111 may latch the sampled digital image data signals corresponding to a horizontal line for each horizontal period. The data driver 111 may apply the latched image data signals to the data lines DL1 to DLj. Thus, the data driver 111 may convert the image data signals DATA' applied from the timing controller 163 into an analog signal (e.g., a data voltage), for example, by using a gamma voltage GMA applied from the power supply unit 168. The data driver 111 may apply each of the image data signals and the converted analog signals to the data lines DL1 to DLj.

The power supply unit 168 may increase or decrease a driving power externally applied thereto, for example, to generate power for driving the touch display panel 70, the timing controller 163, the gate driver 112, the data driver 111 and the sensor driver 161. The power supply unit 168 may include, for example, an output switching element. The output switching element may switch an output voltage of an output terminal of the power supply unit 168. The power supply unit 168 may also include a pulse width modulator PWN. The pulse width modulator PWM may adjust a duty ratio or a frequency of a control signal applied to a control terminal of the output switching element, for example, to increase or decrease the output voltage. Alternatively, the power supply unit 168 may include a pulse frequency modulator PFM. The pulse width modulator PWM may increase the duty ratio of the control signal, for example, to increase the output voltage of the power supply unit 168. The pulse width modulator PWM may decrease the duty ratio of the control signal to lower the output voltage of the power supply unit 168. The pulse frequency modulator PFM may increase the frequency of the control signal, for example, to increase the output voltage of the power supply unit 168. The pulse frequency modulatory PFM may decrease the frequency of the control signal, for example, to lower the output voltage of the power supply unit 168.

The power supply unit 168 may generate various power signals including, for example, a reference voltage VDD, a gamma voltage GMA, a first driving voltage ELVDD, a second driving voltage ELVSS, a gate high voltage VGH, or a gate low voltage VGL. The gamma voltage GMA may be a voltage generated by voltage division of the reference voltage VDD. The reference voltage VDD and the gamma voltage GMA may each be analog gamma voltages, which may be applied to the data driver 111. The gate high voltage VGH may be a relatively high logic voltage of the gate signal. The relatively high logic voltage of the gate signal may be set to be equal to or higher than a threshold voltage of a switching element (e.g., a data switching element Tr_S of FIG. 10) of a pixel. The gate low voltage VGL may be a relatively low logic voltage of the gate signal. The relatively low logic voltage of the gate signal may be set to be an OFF voltage of the switching element. The gate high voltage VGH and the gate low voltage VGL may each be applied to the gate driver 112.

Each of the pixels R, G and B of FIG. 9 may have a circuit configuration described in more detail below. Since respective circuit configurations of the pixels R, G and B are substantially the same; a circuit configuration for one pixel will be described in detail herein.

Figure 10:
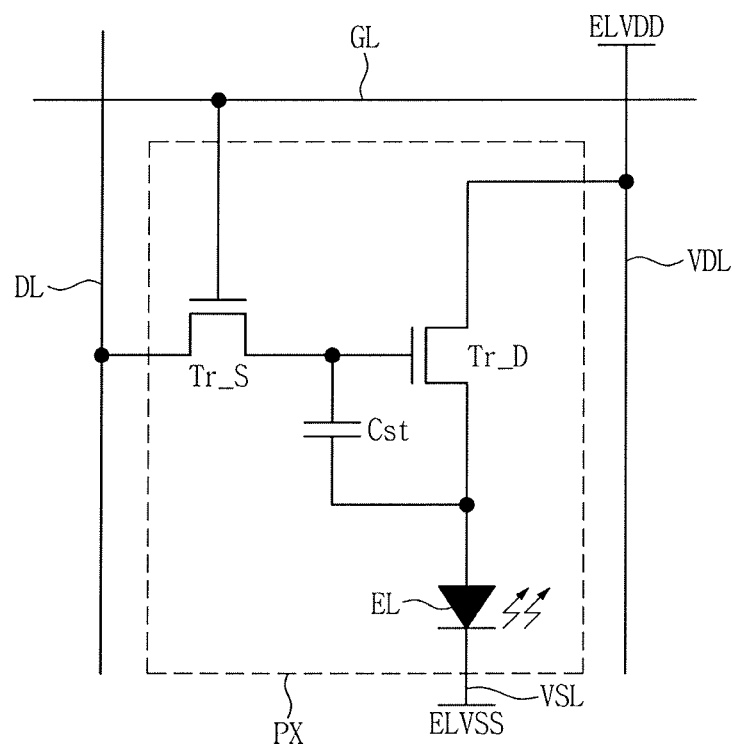
FIG. 10 is a circuit diagram illustrating a pixel of FIG. 9 according to an exemplary embodiment of the present invention.

FIG. 10 is a circuit diagram illustrating a pixel of FIG. 9 according to an exemplary embodiment of the present invention.

Referring to FIG. 10, the pixel PX may include a driving switching element Tr_D, the data switching element Tr_S, a storage capacitor Cst and a light emitting element EL.

The data switching element Tr_S may include a gate electrode, a drain electrode, and a source electrode. The gate electrode may be connected to a gate line GL. The gate electrode may also be connected to each of a data line DL and a gate electrode of the driving switching element Tr_D. The drain electrode may be connected to the data line DL. The source electrode may be connected to the gate electrode of the driving switching element Tr_D.

The driving switching element Tr. D may include the gate electrode, a drain electrode, and a source electrode. The gate electrode may be connected to the source electrode of the data switching element Tr_S. The gate electrode may be connected to each of a high electric potential power line VDL and an anode electrode of the light-emitting element EL. The drain electrode may be connected to the high electric potential power line VDL. The source electrode may be to the anode electrode of the light-emitting element EL.

The driving switching element Tr_D may adjust an amount (e.g., a density) of a driving current flowing from the high electric potential power line VDL to a low electric potential power line VSL, for example, according to a magnitude of a signal applied to the gate electrode of the driving switching element Tr_D.

The storage capacitor Cst may be connected to each of the gate electrode of the driving switching element Tr_D and the anode electrode of the light-emitting element EL. The storage capacitor Cst may store the signal applied to the gate electrode of the driving switching element Tr_D, for example, for one frame period.

The light-emitting element EL may emit light, for example, in accordance with the driving current applied through the driving switching element Tr_D. The light-emitting element EL may emit light of different brightness, for example, according to a level of the driving current. The anode electrode of the light-emitting element EL may be connected to the source electrode of the driving switching element Tr_D. A cathode electrode of the light-emitting element EL may be connected to the low electric potential power line VSL. The light-emitting element EL may be an organic light-emitting diode ("OLED").

Figure 11:
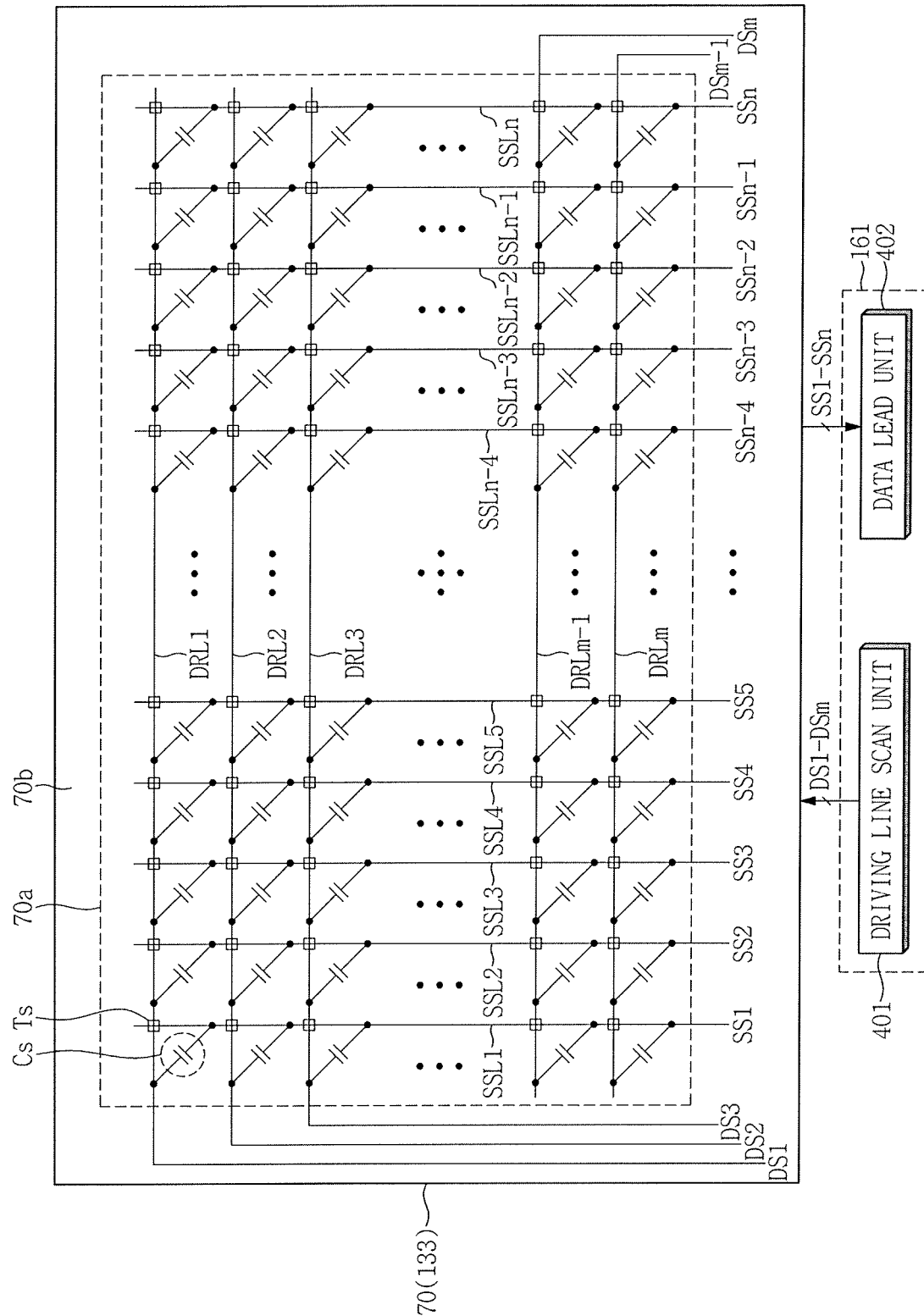
FIG. 11 is a configuration view illustrating a touch panel and a sensor driver of FIG. 8 according to an exemplary embodiment of the present invention.

FIG. 11 is a configuration view illustrating a touch panel and a sensor driver of FIG. 8 according to an exemplary embodiment of the present invention.

Referring to FIG. 11, the touch panel 144 may include m number of driving lines DRL1 to DRLm, n number of sensing lines SSL1 to SSLn, and m*n number of touch sensing elements TS, in which m and n may be natural numbers.

The driving lines DRL1 to DRLm and the sensing lines SSL1 to SSLn may cross each other. The touch sensing element TS may be positioned at each crossing of the driving lines DRL1 to DRLm and the sensing lines SSL1 to SSLn. For example, one touch sensing element TS may be positioned at a point where the first driving line DRL1 and the first sensing line SSL1 cross each other. Thus, the touch sensing element TS may be formed by each of the first driving line DRL1 and the first sensing line SSL1.

One touch sensing element TS may be represented by a capacitor Cs disposed between a driving line and a sensing line, in which the sensing line overlaps the driving line. One touch sensing element TS may be connected to each of one driving line and one sensing line. However, exemplary embodiments of the present invention are not limited thereto.

When a certain portion of the touch panel 144 is touched by a user (e.g., a user's finger) or the like, a capacitance of the capacitor Cs (e.g., the touch sensing element TS) positioned at the touched point may change. By the change in capacitance of the capacitor Cs, a presence of a touch to the point may be identified.

First to m-th driving signals DS1 to DSm may be applied to the first to m-th driving lines DRL1 to DRLm, respectively. First to n-th sensing signals SS1 to SSn may be applied to the first to n-th sensing lines SSL1 to SSLn, respectively.

The n number of touch sensing elements TS arranged along one horizontal line may be connected to one driving line in common. The n number of touch sensing elements TS may further be individually connected to the n number of sensing lines SSL1 to SSLn, respectively.

The m number of touch sensing elements TS arranged along one vertical line may be connected to one sensing line in common. The m number of touch sensing elements TS may further be individually connected to the m number of driving lines DRL1 to DRLm, respectively.

Referring to FIG. 11, the sensor driver 161 may include a driving line scan unit 401 and a data lead unit 402.

The driving line scan unit 401 may sequentially output the first to m-th driving signals DS1 to DSm. The first to m-th driving signals DS1 to DSm may be sequentially output during one frame period. The first to m-th driving signals DS1 to DSm may be sequentially applied to the first to m-th driving lines DRL1 to DRLm, respectively. Accordingly, the first to m-th driving lines DRL1 to DRLm may be sequentially driven from the first driving line DRL1 to the m-th driving line DRLm during one frame period.

The first to m-th driving signals DS1 to DSm may be applied from the driving line scanning unit 401 to the m*n number of touch sensing elements TS, for example, through the first to m-th driving lines DRL1 to DRLm.

In response to the first to m-th driving signals DS1 to DSm, the m*n number of touch sensing elements TS may output m*n number of touch sensing signals. When one driving line is driven, n number of touch sensing elements TS connected to the one driving line may substantially simultaneously output n number of touch sensing signals SS1 to SSn. The n number of touch sensing signals SS1 to SSn may be applied to the data lead unit 402, for example, through the first to n-th sensing lines SSL1 to SSLn, respectively.

The data lead unit 402 may convert the first to n-th touch sensing signals SS1 to SSn from n number of sensing signals into digital signals, respectively. The data lead unit 402 may store the digital signals. Accordingly, m*n number of touch sensing signals may be stored in the data lead unit 402 during one frame period.

The position determination unit 171 may calculate coordinates of each of the first touch line TL1, the second touch line TL2, and another touch point, for example, based on the m*n number of touch sensing signals stored in the data lead unit 402.

Figure 12A:
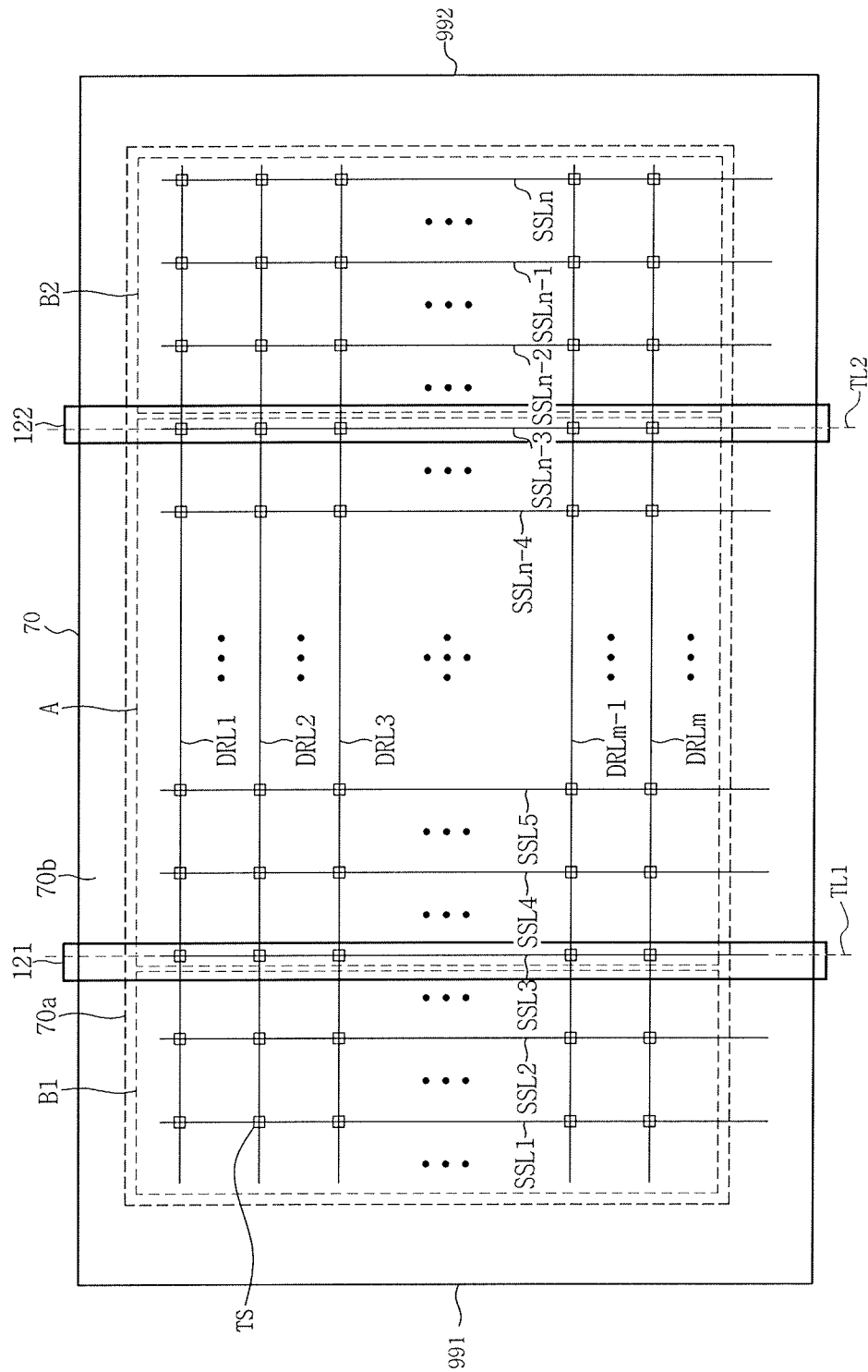
FIGS. 12A and 12B are views illustrating a method of driving a flexible display device including a touch bar according to an exemplary embodiment of the present invention.
Figure 12B:
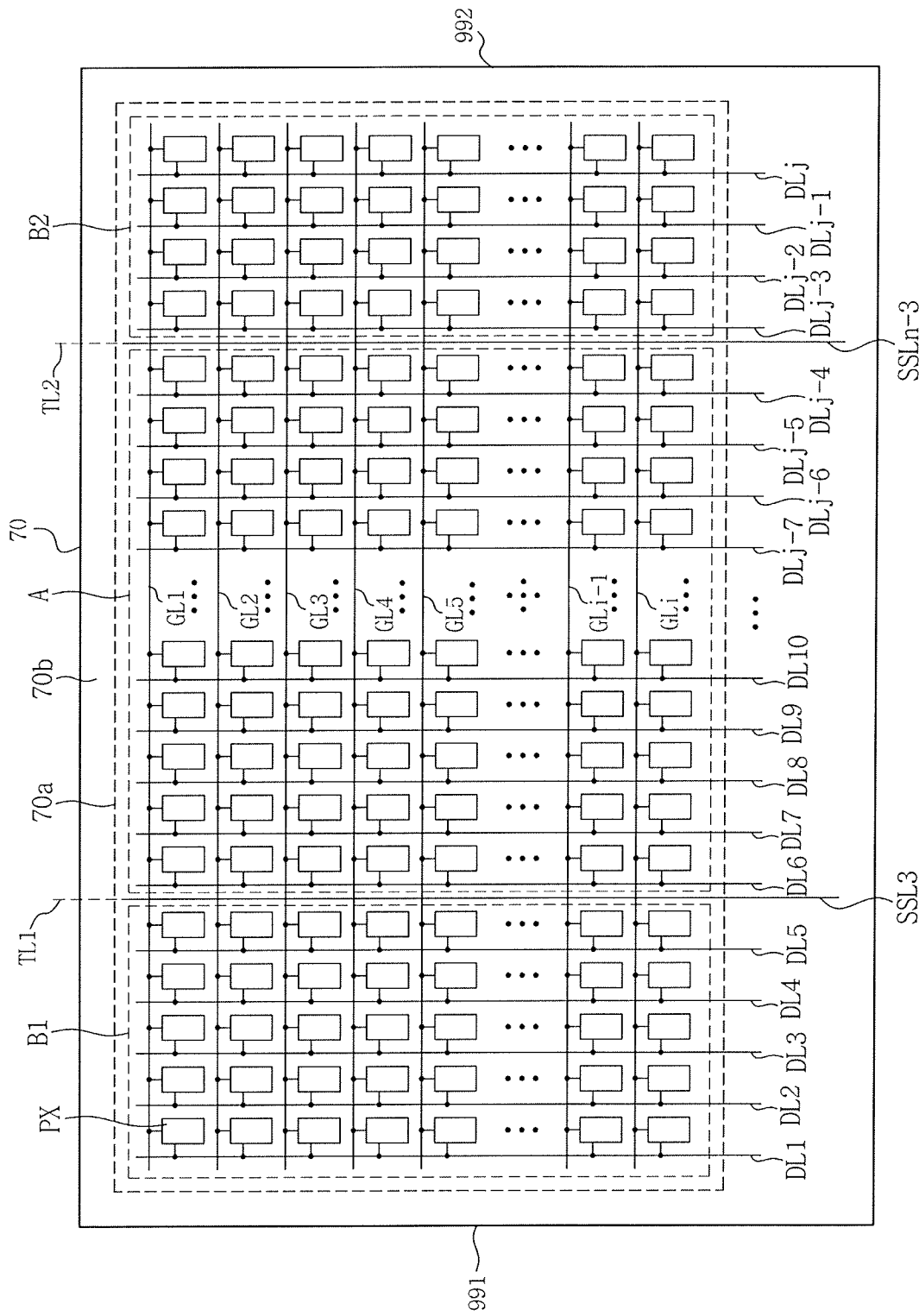

FIGS. 12A and 12B are views illustrating a method of driving a flexible display device including a touch bar according to an exemplary embodiment of the present invention.

Referring to FIG. 12A, a first touch bar 121 may selectively contact touch sensing elements TS (hereinafter "first active touch sensing elements") arranged in a line along one vertical line. A second touch bar 122 may selectively contact touch sensing elements TS (hereinafter "second active touch sensing elements") arranged in a line along another vertical line. For example, the first active touch sensing elements may be touch sensing elements TS connected to a third sensing line SSL3 in common. The second active touch sensing elements may be touch sensing elements TS connected to an (n−3)-th sensing line SSLn−3 in common.

A position determination unit 171 may set a first touch line TL1, for example, according to sensing signals generated from the first active touch sensing elements. The portion determination unit 171 may also set a second touch line TL2, for example, according to sensing signals generated from the second active touch sensing elements. Referring to FIG. 12A, the first touch line TL1 may correspond to the third sensing line SSL3. The second touch line TL2 may correspond to the (n−3)-th sensing line SSLn−3.

A screen division unit 172 may divide a display portion 70a of the touch display panel 70. The screen division unit 172 may divide the display portion 70a into a first non-display area B1, a display area A, and a second non-display area B2, for example, according to the first touch line TL1 and the second touch line TL2.

Referring to FIG. 12A, the screen division unit 172 may set an area of the display portion 70a between the first touch line TL1 (e.g., the third sensing line SSL3) and a first end 991 of the touch display panel 70. The area of the display portion 70a between the first touch lines TL1 and the first end 991 of the touch display panel 70 may be the first non-display area B1. The screen division unit 172 may set an area of the display portion 70a between the second touch line TL2 (e.g., the (n−3)-th sensing line SSLn−3) and a second end 992 of the touch display panel 70. The area of the display portion 70a between the second touch lines TL2 and the second end 992 of the touch display panel 70 may be the second non-display area B2. The screen division unit 172 may set an area of the display portion 70a between the first touch line TL1 and the second touch line TL2. The area of the display portion 70a between the first touch line TL1 and the second touch lines TL2 may be the display area A. The first end 991 of the touch display panel 70 may be positioned inside a first roller housing 22. The second end 992 of the touch display panel 70 may be positioned inside the second roller housing 32.

A panel driver 180 may deactivate the first non-display area B1. According to an exemplary embodiment of the present invention, the panel driver 180 might not display an image in the first non-display area B1. For example, the data driver 111 of the panel driver 180 may turn off (e.g., turn off light emission in) pixels PX of the first non-display area B1. The data driver 111 of the panel driver 180 might not drive data lines positioned at the first non-display area B1. Referring to FIG. 12B, the data driver 111 might not apply image data signals to first to fifth data lines DL1, DL2, DL3, DL4 and DL5 of the first non-display area B1. Accordingly, image data signals of pixels PX connected to the first to fifth data lines DL1, DL2, DL3, DL4 and DL5 may be discharged, for example, such that an image is not displayed in the first non-display area B1. Alternatively, the data driver 111 may apply a ground voltage (i.e., voltage of 0) to the first to fifth data lines DL1, DL2, DL3, DL4 and DL5.

In order to deactivate the first non-display area B1, the panel driver 180 might not read touch sensing signals from touch sensing elements TS-positioned at the first non-display area B1 of FIG. 12A. For example, a sensor driver 161 of the panel driver 180 might not read touch sensing signals output from the touch sensing elements TS positioned at the first non-display area B1. Thus, the sensor driver 161 may ignore touch sensing signals output from the touch sensing elements TS positioned at the first non-display area B1. The sensor driver 161 might not read touch sensing signals from each of first and second sensing lines SSL1 and SSL2 connected to the touch sensing elements TS of the first non-display area B1. Accordingly, although the first non-display area B1 may be touched, touch sensing signals from the first and second sensing lines SSL1 and SSL2 may be ignored. Thus, the first non-display area B1 may be deactivated.

According to an exemplary embodiment of the present invention, when a position of the first touch line TL1 changes by rotation of a first roller 21, values of touch sensing signals applied from the first active touch sensing elements located on the first touch line TL1 may change. Thus, the sensor driver 161 may sense the changed touch sensing signals from the first active touch sensing elements. Since the first active touch sensing elements may be positioned at the display area A to maintain a driving state, the sensor driver 161 may sense a change in touch sensing signals from the first active touch sensing elements although the position of the first touch line TL1 changes. The sensor driver 161 may read touch sensing signals from the touch sensing elements TS of the first non-display area B1. The sensor driver 161 may also read touch sensing signals from the touch sensing elements IS of the display area A. Thus, the touch sensing elements TS of the first non-display area B1 resume operation. The sensor driver 161 may detect a changed position of the first touch line TL1, for example, using the touch sensing elements TS. The sensor driver 161 may reset the first non-display area B1, for example, according to the detected position of the first touch line TL1.

When the touch sensing elements (e.g., m*n number of touch sensing elements TS) provided in the touch display panel 70 are connected to different driving lines (e.g., m*n number of driving lines), respectively, the sensor driver 161 may stop the operation of the touch sensing elements TS of the first non-display area B1. For example, the sensor driver 161 might not apply driving signals to driving lines connected to respective touch sensing elements TS located at the first non-display area B1. For example, the sensor driver 161 might not apply driving signals to touch sensing elements TS connected to the first sensing line SSL1. The sensor driver 161 might also not apply driving signals to touch sensing elements TS connected to the second sensing line SSL2. Thus, touch sensing signals might not be generated from the touch sensing elements TS of the first non-display area B1.

According to an exemplary embodiment of the present invention, the touch sensing elements (e.g., m*n number of touch sensing elements TS) provided in the touch display panel 70 may be individually connected to different driving lines (e.g., m*n number of driving lines), respectively. The touch sensing elements may also be individually connected to different sensing lines (e.g., m*n number of sensing lines), respectively. Thus, the sensor driver 161 might not selectively apply driving signals to the touch sensing elements TS located at the first non-display area B1. The sensor driver 161 might also not selectively receive sensing signals from the touch sensing elements TS located at the first non-display area B1.

The panel driver 180 may deactivate the second non-display area B2. For example, the panel driver 180 might not display an image in the second non-display area B2. For example, the data driver 111 of the panel driver 180 may turn off (e.g., turn off light emission in) pixels PX of the second non-display area B2. As an example, the data driver 111 might not drive data lines located at the second non-display area B2. Referring to FIG. 12B, the data driver 111 might not apply image data signals to (j−3)-th to j-th data lines DLj−3 to DLj of the second non-display area B2. Accordingly, image data signals of pixels PX connected to the (j−3)-th to j-th data lines DLj−3 to DLj may be discharged. Thus, an image might not be displayed in the second non-display area B2. According to an exemplary embodiment of the present invention, the data driver 111 may apply a ground voltage (i.e., a voltage of 0) to the (j−3)-th to j-th data lines DLj−3 to DLj.

Referring to FIG. 12A, in order to deactivate the second non-display area B2, the panel driver 180 might not read touch sensing signals from the touch sensing elements TS positioned at the second non-display area B2. For example, the sensor driver 161 of the panel driver 180 might not read touch sensing signals output from the touch sensing elements TS positioned at the second non-display area B2. Thus, the sensor driver 161 may ignore touch sensing signals output from the touch sensing elements TS positioned at the second non-display area B2. Accordingly, the sensor driver 161 might not read touch sensing signals from (n−2)-th, (n−1)-th and n-th sensing lines SSLn−1, SSLn−1 and SSLn connected to the touch sensing elements TS of the second non-display area B2. Although the second non-display area B2 may be touched, touch sensing signals from the (n−2)-th, (n−1)-th, and n-th sensing lines SSLn−1, SSLn−1 and SSLn may be ignored. Thus, the second non-display area B2 may be deactivated.

According to an exemplary embodiment of the present invention, when a position of the second touch line TL2 changes by rotation of a second roller 31, values of touch sensing signals applied from the second active touch sensing elements disposed on the second touch line TL2 may change. Accordingly, the sensor driver 161 may sense the changed touch sensing signals from the second active touch sensing elements. Since the second active touch sensing elements may be positioned at the display area A to maintain a driving state, the sensor driver 161 may sense a change in touch sensing signals applied from the second active touch sensing elements although the position of the second touch line TL2 changes. The sensor driver 161 may read touch sensing signals from the touch sensing elements TS of the second non-display area B2. The sensor driver 161 may read touch sensing signals from the touch sensing elements TS of the display area A. Thus, the touch sensing elements TS of the second non-display area B2 may resume operation. The sensor driver 161 may detect a changed position of the second touch line TL2 using the touch sensing elements TS. The sensor driver 161 may reset the second non-display area B2, for example, according to the detected position of the second touch line TL2.

When the touch sensing elements TS (e.g., m*n number of touch sensing elements) of the touch display panel 70 are individually connected to different driving lines (e.g., m*n number of driving lines), respectively, the sensor driver 161 may stop an operation of the touch sensing elements TS of the second non-display area B2. The sensor driver 161 might not apply driving signals to driving lines connected to respective the touch sensing elements TS positioned at the second non-display area B2. For example, the sensor driver 161 might not apply driving signals to each of touch sensing elements TS connected to the (n−2)-th sensing line SSLn−2, touch sensing elements TS connected to the (n−1)-th sensing line SSLn−1, and touch sensing elements TS connected to the n-th sensing line SSLn. Thus, touch sensing signals might not be generated from the touch sensing elements TS of the second non-display area B2.

According to an exemplary embodiment of the present invention, the touch sensing elements (e.g., m*n number of touch sensing elements TS) of the touch display panel 70 may be individually connected to different driving lines (e.g., m*n number of driving lines), respectively. The touch sensing elements may also be individually connected to different sensing lines (e.g., m*n number of sensing lines), respectively. Accordingly, the sensor driver 161 might not selectively apply driving signals to the touch sensing elements TS positioned at the second non-display area B2. The sensor driver 161 might not selectively receive sensing signals from the touch sensing elements TS located at the second non-display area B2.

According to an exemplary embodiment of the present invention, the panel driver 180 may activate the display area A. For example, the panel driver 180 may display an image on the display area A. For example, the panel driver 180 may turn on (e.g., turns on light in) at least one pixel PX of the display area A. Referring to FIG. 12B, the data driver ill of the panel driver 180 may drive data lines positioned at the display area A. For example, the data driver 111 may apply image data signals to the sixth to (j–4)-th data lines DL6 to DLj–4 positioned at the display area A.

The sensor driver 161 of the panel driver 180 may drive touch sensing elements TS positioned at the display area A. For example, the sensor driver 161 may apply driving signals to touch sensing elements TS connected to the third to (n–3)-th sensing lines SSL3 to SSLn–3 positioned at the display area A. The sensor driver 161 may receive touch sensing signals from the touch sensing elements TS.

Figure 13:
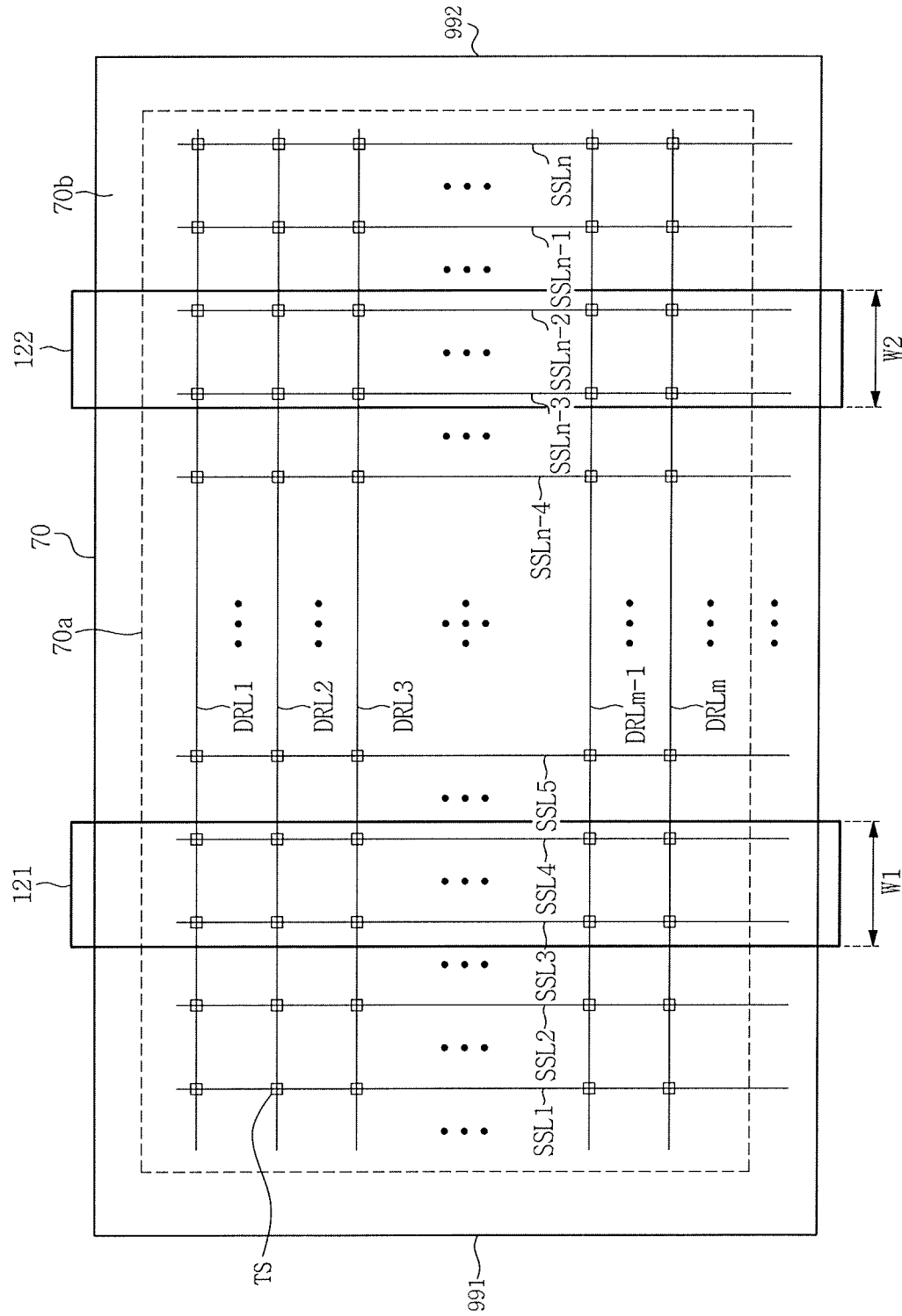
FIG. 13 is a view illustrating widths of a first touch bar and a second touch bar of FIG. 4 according to an exemplary embodiment of the present invention.

FIG. 13 is a view illustrating widths of a first touch bar and a second touch bar of FIG. 4 according to an exemplary embodiment of the present invention.

Referring to FIG. 13, the first touch bar 121 may have a width W1. The width W1 may be of a size suitable to contact touch sensing elements TS of adjacent columns. For example, the first touch bar 121 may have the width W1. The width W1 may overlap the entirety of touch sensing elements TS in a first column connected to the third sensing line SSL3 and touch sensing elements TS in a second column connected to the fourth sensing line SSL4. According to an exemplary embodiment of the present invention, the first touch bar 121 may have a width of a size suitable to contact touch sensing elements TS of k number of columns, in which k may be a natural number greater than 2.

When the first touch bar 121 contacts touch sensing elements TS of a plurality of columns, the panel driver 180 may set the first touch line TL1 according to touch sensing elements TS on one of the plurality of columns. In addition, the panel driver 180 may set the first touch line TL1 according to touch sensing elements TS on at least two of the plurality of columns. Accordingly, a plurality of first touch lines TL1 may be set. An area between adjacent first touch lines TL1 may be set. The area between adjacent first touch lines TL1 may be the first non-display area B1.

Referring to FIG. 13, the second touch bar 122 may have a width W2. The width W2 may be a size suitable to contact touch sensing elements TS of adjacent columns. The width W2 may overlap the touch sensing elements TS in a first column connected to the (n–3)-th sensing line SSLn–3 and touch sensing elements TS in a second column connected to the (n–2)-th sensing line SSLn–2. According to an exemplary embodiment of the present invention, the second touch bar 122 may have a width of a size suitable to contact touch sensing elements IS of k number of columns.

When the second touch bar 122 contacts touch sensing elements TS of a plurality of columns, the panel driver 180 may set the second touch line TL2 according to touch sensing elements TS on one of the plurality of columns. In addition, the panel driver 180 may set the second touch line TL2 according to touch sensing elements TS on at least two of the plurality of columns. Accordingly, a plurality of second touch lines TL2 may be set. An area between adjacent second touch lines TL2 may be set. The area between adjacent second touch lines TL2 may be the second non-display area B2.

Figure 14:
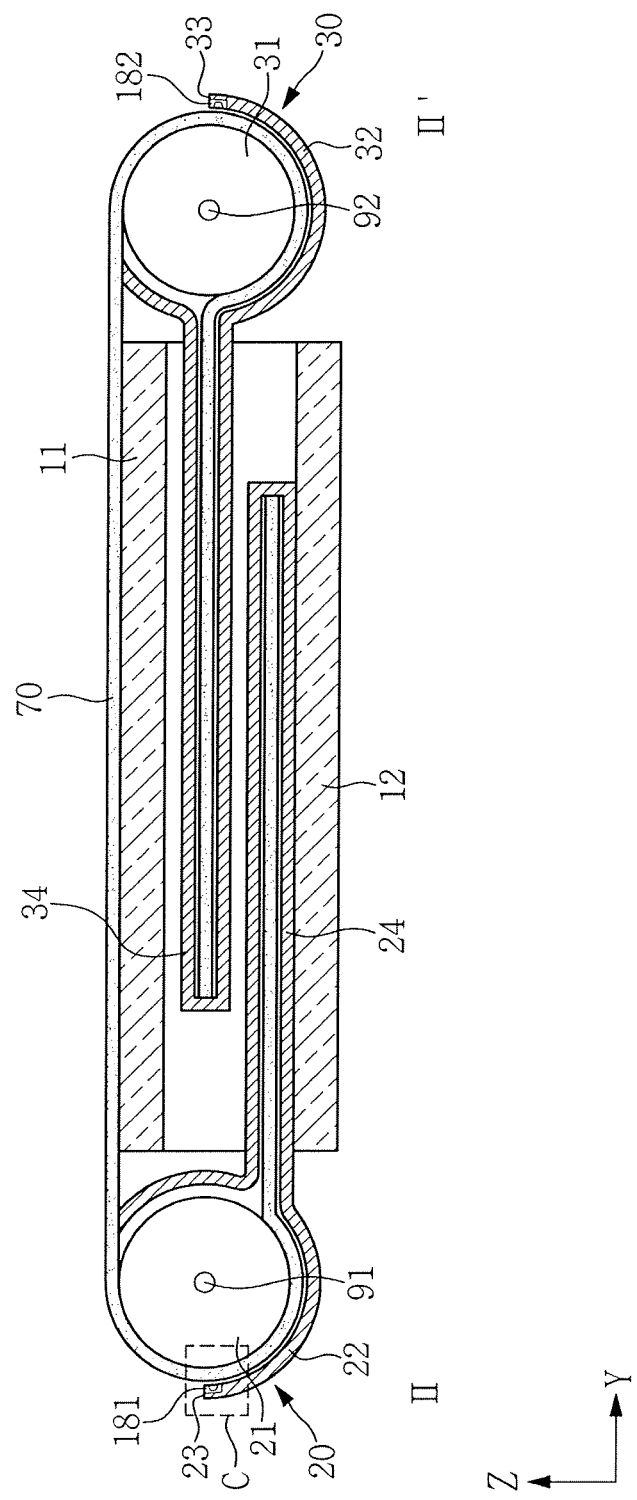
FIG. 14 is a cross-sectional view taken along a line II-II' of FIG. 1 according to an exemplary embodiment of the present invention.
Figure 15:
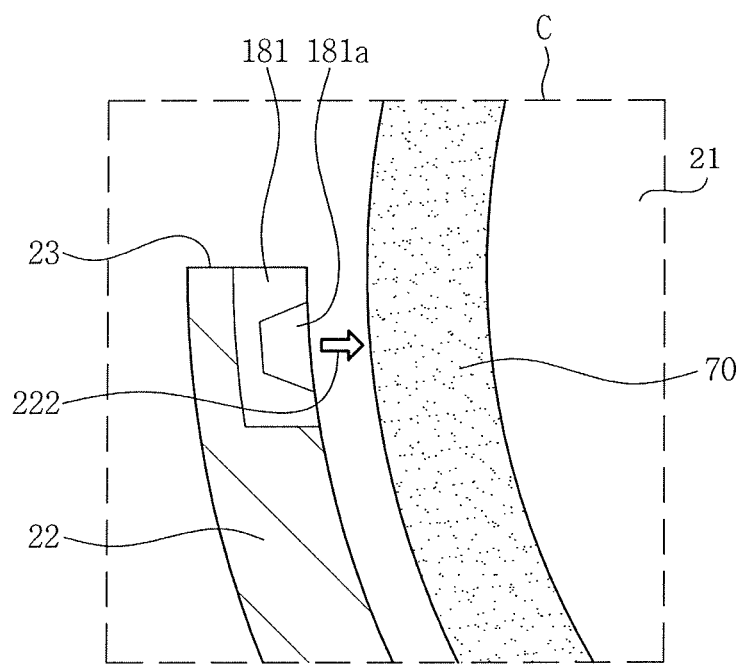
FIG. 15 is an enlarged view illustrating a portion C of FIG. 14 according to an exemplary embodiment of the present invention.
Figure 16:
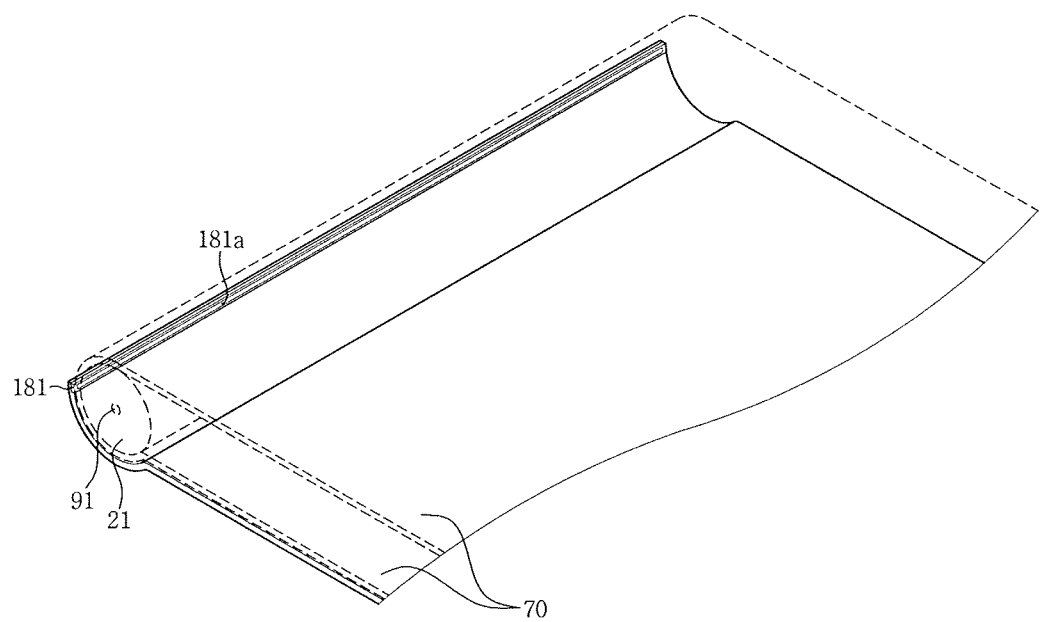
FIG. 16 is a configuration view illustrating a first light source unit of FIG. 14 according to an exemplary embodiment of the present invention.

FIG. 14 is a cross-sectional view taken along a line II-II' of FIG. 1 according to an exemplary embodiment of the present invention. FIG. 15 is an enlarged view illustrating a portion C of FIG. 14 according to an exemplary embodiment of the present invention. FIG. 16 is a configuration view illustrating a first light source unit of FIG. 14 according to an exemplary embodiment of the present invention.

Referring to FIGS. 14 and 15, the flexible display device 100 according to an exemplary embodiment of the present invention may include a first light source unit 181 alternatively to the first touch bar 121. Referring to FIG. 14, the flexible display device 100 according to an exemplary embodiment of the present invention may also include a second light source unit 182 alternatively to the second touch bar 122.

Referring to FIG. 16, the first light source unit 181 may have a long bar shape.

The first light source unit 181 may be positioned inside a first roller housing 22. For example, referring to FIGS. 14 to 16, the first light source unit 181 may be disposed between the first roller housing 22 and a touch display panel 70.

The first light source unit 181 may be disposed adjacent to a first opening 23.

The first light source unit 181 might not be in contact with the touch display panel 70.

Referring to FIG. 15, the first light source unit 181 may irradiate a light 222 to the touch display panel 70. For example, the first light source unit 181 may irradiate the light 222 to a surface of the touch display panel 70 on which a display portion 70a is positioned. As described in more detail below, the light 222 from the first light source unit 181 may be applied to light sensing elements positioned at the touch display panel 70.

Referring to FIGS. 15 and 16, the first light source unit 181 may have a slit 181a. The slit 181a may be defined on a surface of the first light source unit 181 facing the touch display panel 70. The slit 181a may be substantially parallel to a central axis 91 of a first roller 21. The light 222 from the first light source unit 181 may be selectively irradiated to light sensing elements in a column through the slit 181a.

The first light source unit 181 may irradiate a light having a predetermined relatively short wavelength. For example, the first light source unit 181 may emit an ultraviolet (UV) light.

The first light source unit 181 may cross the touch display panel 70. Accordingly, the first light source unit 181 may cross facing sides of the touch display panel 70. Thus, the first light source unit 181 may cross facing sides of sides defining the touch display panel 70. Herein, the facing sides may refer to sides having a curved shape, for example, while being rolled around the first roller 21 or a second roller 31.

The second light source unit 182 may have a long bar shape. The long bar shape may be similar to the long bar shape of the first light source unit 181.

The second light source unit 182 may be positioned inside a second roller housing 32. Referring to FIG. 14, the second light source unit 182 may be disposed between the second roller housing 32 and the touch display panel 70.

The second light source unit 182 may be disposed adjacent to a second opening 33.

The second light source unit 182 might not be in contact with the touch display panel 70.

The second light source unit 182 may irradiate a light to the touch display panel 70. For example, the second light source unit 182 may irradiate the light to one of surfaces of the touch display panel 70 on which the display portion 70a is positioned. As described in more detail below, the light from the second light source unit 182 may be applied to light sensing elements positioned at the touch display panel 70.

The second light source unit 182 may have a slit. The slit may be defined on a surface of the second light source unit 1282, for example, facing the touch display panel 70. The slit may be substantially parallel to a central axis 92 of the second roller 31. The light from the second light source unit 182 may be selectively irradiated to light sensing elements in one column through the slit.

The second light source unit 182 may irradiate a light having a predetermined relatively short wavelength. For example, the second light source unit 182 may emit an ultraviolet (UV) light.

The second light source unit 182 may cross the touch display panel 70. Accordingly, the second light source unit 182 may cross facing sides of the touch display panel 70. Thus, the second light source unit 182 may cross facing sides of sides defining the touch display panel 70. The facing sides may refer to sides having a curved shape, for example, while being rolled around the first roller 21 or the second roller 31.

Figure 17:
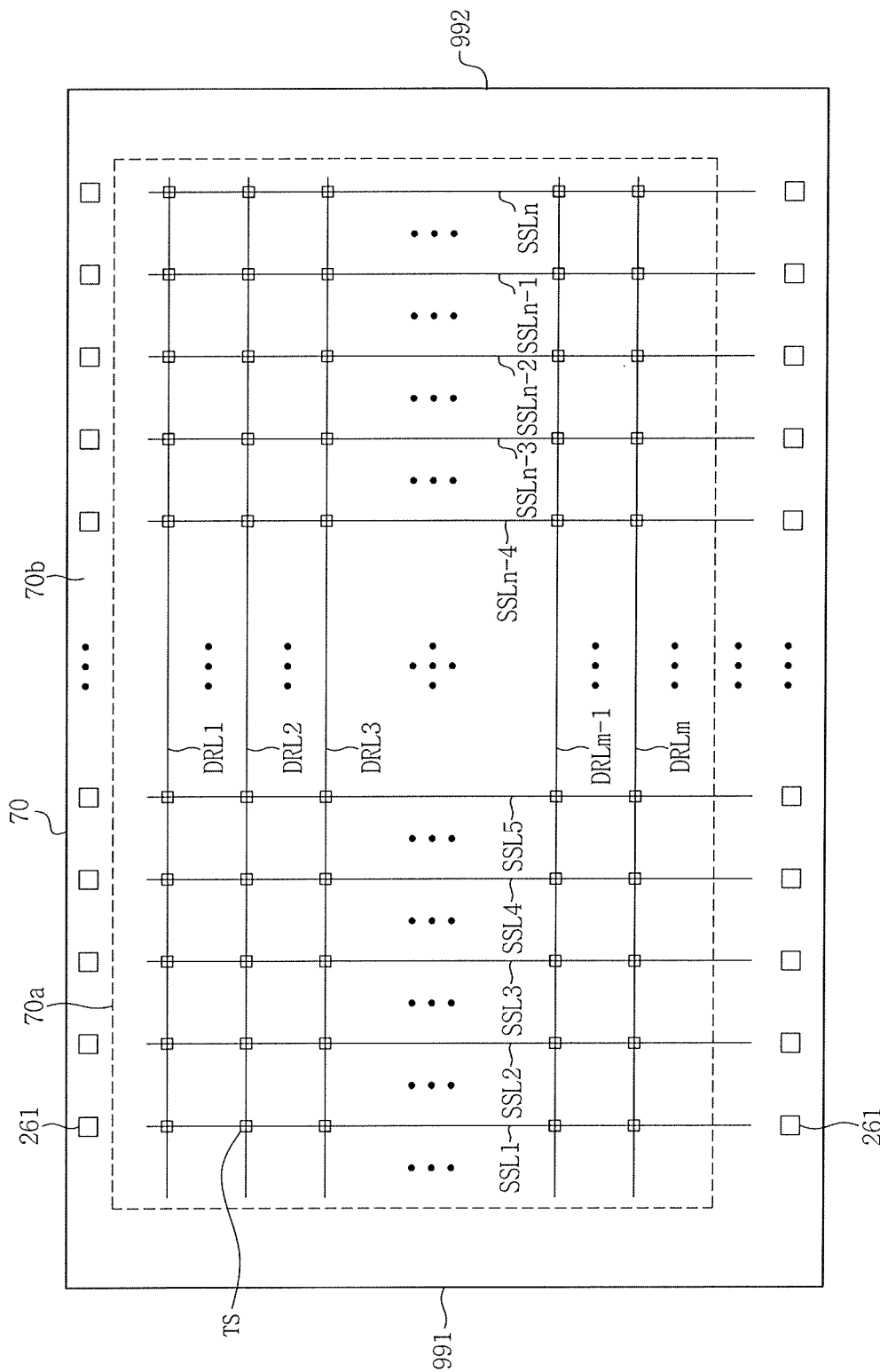
FIG. 17 is a configuration view illustrating a touch display panel of FIG. 14 according to an exemplary embodiment of the present invention.

FIG. 17 is a configuration view illustrating a touch display panel of FIG. 14 according to an exemplary embodiment of the present invention.

Referring to FIG. 17, when the flexible display device 100 includes the first and second light sources 181 and 182, the touch display panel 70 may further include a plurality of light sensing elements 261.

The light sensing elements 261 may be positioned in a non-display portion 70b of the touch display panel 70. The light sensing elements 261 may be positioned corresponding to the touch sensing elements TS. For example, one of the light sensing elements 261 may be located on a substantially same column as a column on which a plurality of touch sensing elements TS are arranged in a line along one sensing line. For example, two light sensing elements 261, respectively on opposite end portions of a first sensing line SSL1, may be positioned in a substantially same column as a column in which the touch sensing elements TS connected to the first sensing line SSL1 are positioned.

The light sensing elements 261 may be positioned corresponding to sensing lines SSL1 to SSLn connected to the touch sensing elements TS. For example, two light sensing elements 261 having the display portion 70a therebetween may be disposed on an extension line of the first sensing line SSL1 positioned at the display portion 70a.

The light sensing elements 261 may output light sensing signals in response to the light emitted from each of the first light source unit 181 and the second light source unit 182. The light sensing elements 261 may react to a light of a predetermined relatively short wavelength from each of the first light source unit 181 and the second light source unit 182. For example, the light sensing elements 261 may generate a light sensing signal solely in response to an ultraviolet (UV) light. According to an exemplary embodiment of the present invention, the light sensing elements 261 might not react to visible light.

The light sensing signals from the light sensing elements 261 may be applied to the panel driver 180.

The light sensing element 261 may be manufactured in substantially a same process as a switching element of the pixel PX. For example, the light sensing element 261 may be manufactured in substantially a same process as a process in which a data switching element Tr_S or a driving switching element Tr_D of the pixel PX is manufactured. Accordingly, an oxide semiconductor may be used as a semiconductor layer of the light sensing element 261.

The panel driver 180 may divides the display portion 70a of the touch display panel 70. The panel driver 180 may divide the display portion 70a of the touch display panel 70 into a display area and a non-display area, for example, according to positions of the light sensing elements 261 receiving light from each of the first light source unit 181 and the second light source unit 182. The panel driver 180 may receive light sensing signals generated from the light sensing elements 261 irradiated with the light from each of the first light source unit 181 and the second light source unit 182. The panel driver 180 may detect positions of the light sensing elements 261 irradiated with the light from the first light source unit 181. The panel driver 180 may detect positions of the light sensing elements 261 irradiated with the light from the second light source unit 182.

As the first light source unit 181 may have a relatively straight bar shape crossing the touch display panel 70, the light sensing elements 261 irradiated with the light from the first light source unit 181 may be arranged in a line along the first light source unit 181. As the second light source unit 182 may have a relatively straight bar shape crossing the touch display panel 70, the light sensing elements 261 irradiated with the light from the second light source unit 182 may be arranged in a line along the second light source unit 182.

A light sensing element 261 irradiated with light from the first light source unit 181 generating a light sensing signal may be referred as a first active light sensing element. A light sensing element 261 irradiated with light from the second light source unit 182 generating a light sensing signal is to be defined as a second active light sensing element.

The panel driver 180 may detect positions of the first active light sensing elements in the touch display panel 70. The panel driver 180 may detect positions of the second active light sensing elements in the touch display panel 70. Accordingly, the panel driver 180 may detect positions of the first active light sensing elements in the display portion 70a. The panel driver 180 may detect positions of the second active light sensing elements in the display portion 70a. The position of the first active light sensing element may refer to a position of the first active light sensing element in the display portion 70a. The position of the second active light sensing element may refer to a position of the second active light sensing element in the display portion 70a.

The panel driver 180 may divide the display portion 70a of the touch display panel 70. The panel driver 180 may divide the display portion 70a of the touch display panel 70 into a display area and a non-display area according to the positions of the first active light sensing elements and the positions of the second active light sensing elements. The panel driver 180 may set an imaginary line TL1 (hereinafter "a first touch line") and an imaginary line TL2 (hereinafter "a second touch line"). The first touch line may pass through at least two of the first active light sensing elements. The second touch line may pass through at least two of the second active light sensing elements. Thus, the panel driver 180 may assume a plurality of touch points between adjacent first active light sensing elements. The panel driver 180 may also assume a plurality of touch points between adjacent second active light sensing elements. The first touch line TL1 may cross the display portion 70a. Accordingly, the first touch line TL1 may cross facing sides among sides defining the display portion 70a. The second touch line TL2 may cross the display portion 70a. Accordingly, the second touch line TL2 may cross facing sides of the display portion 70a. The facing sides of the display portion 70a may refer to sides having a curved shape, for example, while being rolled around the first roller 21 or the second roller 31.

The panel driver 180 may divide the display portion 70a of the touch display panel 70. The panel driver 180 may divide the display portion 70a of the touch display panel 70 into a display area and a non-display area, for example, according to the first touch line TL1 and the second touch line TL2.

The panel driver 180 may activate at least a portion of the display area. The panel driver 180 may deactivate the non-display area. As an example, the panel driver 180 may display an image in at least a portion of the display area. The panel driver 180 might not display an image in the non-display area. The panel driver 180 may drive the touch sensing elements TSn in the display area. The panel driver 180 may also stop the operation of at least one of the touch sensing elements TS in the non-display area.

The panel driver 180 may include a sensor driver 161, a position determination unit 171, a screen division unit 172, a timing controller 163, a gate driver 112, a data driver 111, and a power supply unit 168.

The panel driver 180 may be positioned at the driving module unit 80.

The sensor driver 161 may drive the touch sensing elements TS of the touch display panel 70. The sensor driver 161 may read sensing results, i.e., touch sensing signals. The sensing results may be generated from the driven touch sensing elements TS. In addition, the sensor driver 161 may drive the light sensing elements 261 of the touch display panel 70. The sensor driver 161 may read sensing results, i.e., light sensing signals. The sensing results may be generated from the driven light sensing element 261.

The position determination unit 171 may detect positions of each of the first active light sensing elements and the second active light sensing elements, for example, according to the light sensing signals from the sensor driver 161. The position determination unit 171 may set the first touch line TL1, for example, according to the positions of the first active light sensing elements. The position determination unit 171 may set the second touch line TL2, for example, according to the positions of the second active light sensing elements. Accordingly, the position determination unit 171 may calculate coordinates of each of the first touch line TL1 and the second touch line TL2.

According to an exemplary embodiment of the present invention, when different touch sensing signals are further applied from the sensor driver 161, the position determination unit 171 may further detect coordinates of another touch point on the touch display panel 70 based on the touch sensing signals.

The screen division unit 172 may divide the display portion 70a of the touch display panel 70. The screen division unit 172 may divide the display portion 70a of the touch display panel 70 into a display area and a non-display area, for example, according to the positions of the first active light sensing elements and the second active light sensing elements. For example, the screen division unit 172 may divide the display portion 70a of the touch display panel 70 into a display area and a non-display area based on the first touch line TL1 and the second touch line TL2. For example, the display portion 70a of the touch display panel 70 may be divided into three areas A, B1 and B2.

Figure 18:
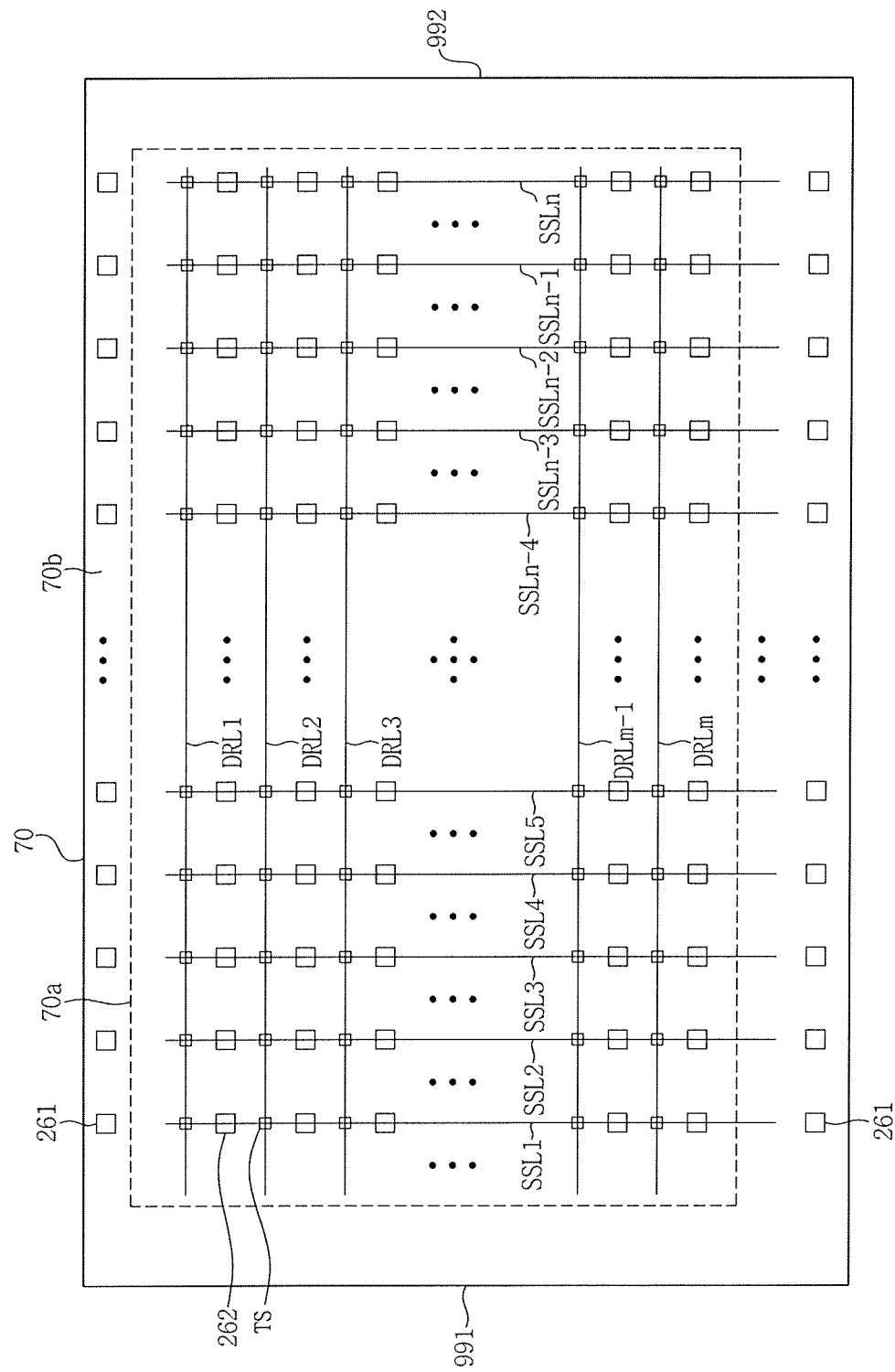
FIG. 18 is a configuration view illustrating a touch display panel of FIG. 14 according to an exemplary embodiment of the present invention.

FIG. 18 is a configuration view illustrating a touch display panel of FIG. 14 according to an exemplary embodiment of the present invention.

Referring to FIG. 18, the touch display panel 70 may include a plurality of first light sensing elements 261 and a plurality of second light sensing elements 262.

The first light sensing elements 261 may be positioned at a non-display portion 70b of the touch display panel 70. The first light sensing elements 261 may be substantially the same as the light sensing elements 261 of FIG. 17.

The second light sensing elements 262 may be positioned at a display portion 70a of the touch display panel 70. The second light sensing elements 262 may be positioned corresponding to touch sensing elements TS. For example, one of the second light sensing elements 262 may be positioned in a substantially same column as a column in which a plurality of touch sensing elements TS are arranged in a line along one sensing line. Thus, the second light sensing element 262 may be positioned along one sensing line located at the display portion 70a.

Referring to FIG. 18, the number of the second light sensing elements 262 may be substantially equal to the number of the touch sensing elements TS.

Among second light sensing elements 262 and touch sensing elements TS located in one column, the second light sensing elements 262 may be located in odd-numbered rows and the touch sensing elements TS may be located in even-numbered rows. Among second light sensing elements 262 and touch sensing elements TS located in one column, the touch sensing elements TS may be located in odd-numbered rows and the second light sensing element 262 may be located in even-numbered rows.

The first light sensing element 261 and the second light sensing element 262 may be manufactured in a substantially same process as a process in which a switching element of a pixel PX is manufactured.

Figure 19:
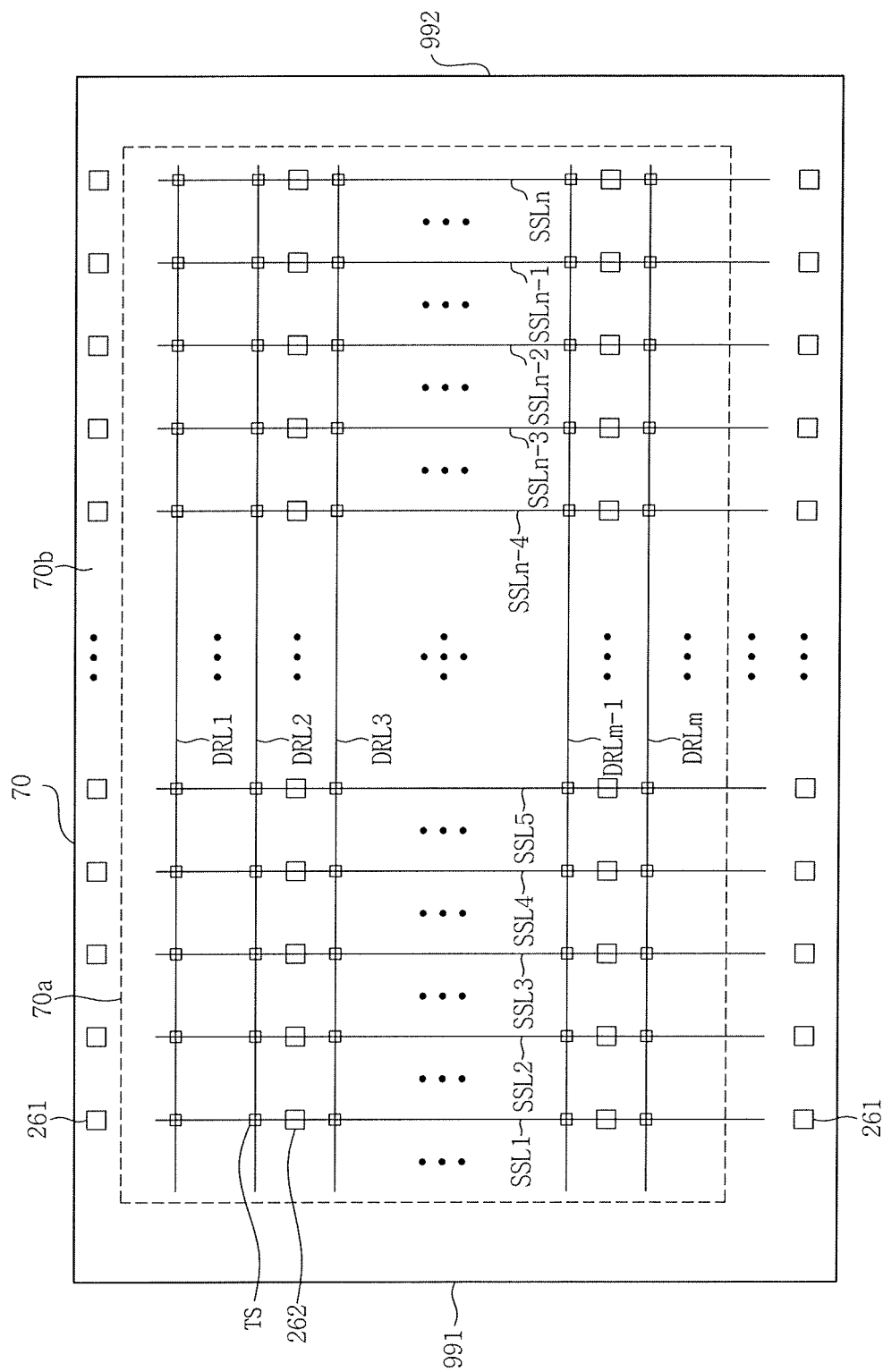
FIG. 19 is a configuration view illustrating a touch display panel of FIG. 14 according to an exemplary embodiment of the present invention.

FIG. 19 is a configuration view illustrating a touch display panel of FIG. 14 according to an exemplary embodiment of the present invention.

Referring to FIG. 19, the touch display panel 70 may include a plurality of first light sensing elements 261 and a plurality of second light sensing elements 262.

The first light sensing elements 261 may be positioned at a non-display portion 70b of the touch display panel 70. The first light sensing elements 261 may be substantially the same as the light sensing elements 261 of FIG. 17.

The second light sensing elements 262 may be positioned at a display portion 70a of the touch display panel 70. The second light sensing elements 262 may be substantially the same as the second light sensing elements 262 of FIG. 18.

Referring to FIG. 19, the number of the second light sensing elements 262 may be less than the number of touch sensing elements TS.

Figure 20:
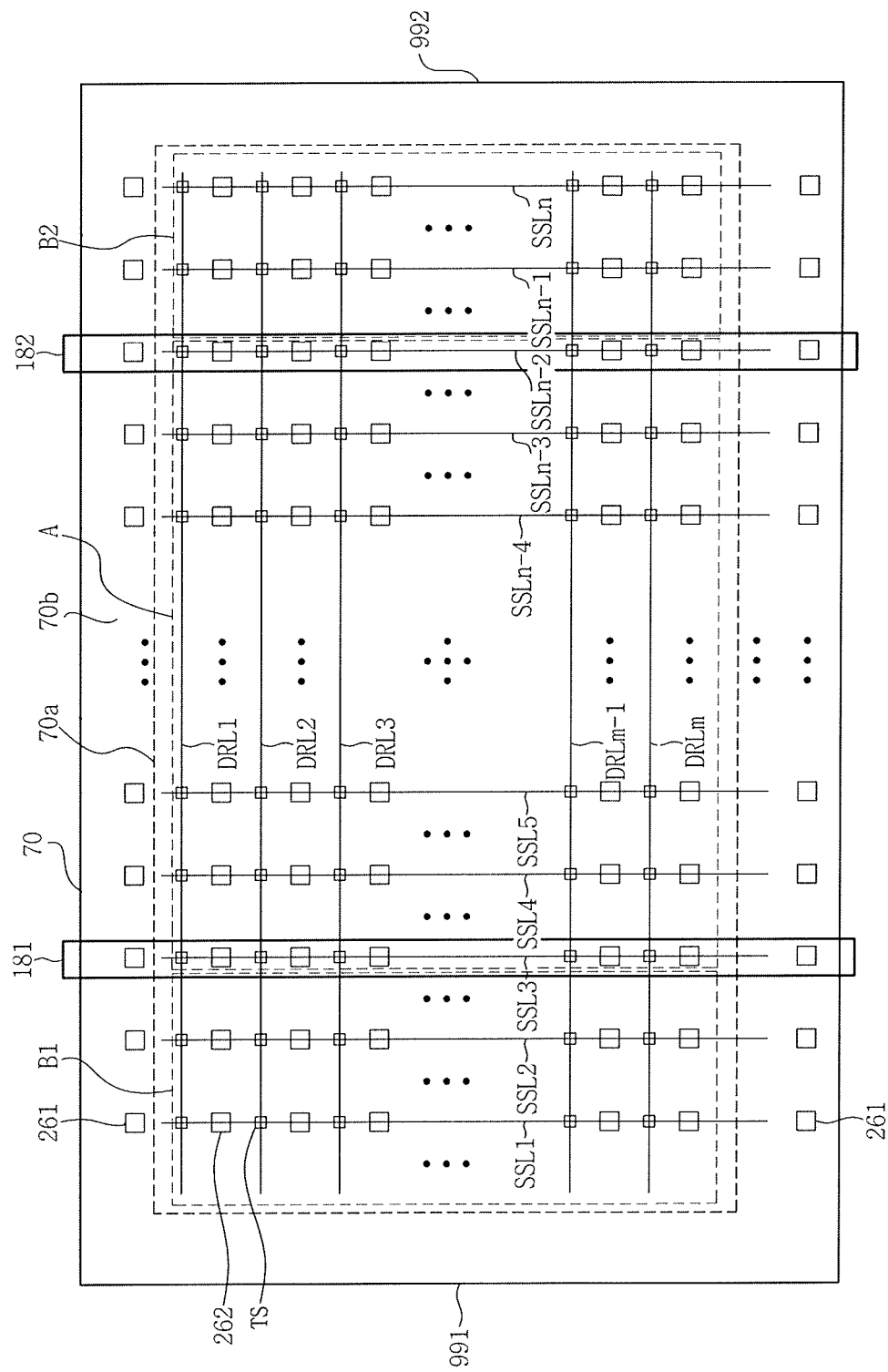
FIG. 20 is a view illustrating a method of driving a flexible display device including a light source unit and light sensing elements according to an exemplary embodiment of the present invention.

FIG. 20 is a view illustrating a method of driving a flexible display device including a light source unit and light sensing elements according to an exemplary embodiment of the present invention.

Referring to FIG. 20, a light from the first light source unit 181 may be irradiated to each of first and second light sensing elements 261 and 262 (hereinafter, "first active light sensing elements"). The first and second light sensing elements 261 and 262 may be arranged in a line along a first vertical line. A light from the second light source unit 182 may be irradiated to each of first and second light sensing elements 261 and 262 (hereinafter, "second active light sensing elements"). The first and second light sensing elements 261 and 262 may be arranged in a line along a second vertical line. For example, the first active light sensing elements may be light sensing elements 261 arranged in a line along a third sensing line SSL3, and the second active light sensing elements may be light sensing elements 261 arranged in a line along an (n−2)-th sensing line SSLn−2.

A position determination unit 171 may set a first touch line TL1, for example, according to light sensing signals generated from the first active light sensing elements. The position determination unit 171 may set a second touch line TL2, for example, according to light sensing signals generated from the second active light sensing elements. Accordingly, the first touch line TL1 may correspond to the third sensing line SSL3. The second touch line TL2 may correspond to the (n−2)-th sensing line SSLn−2.

A screen division unit 172 may divide a display portion 70a into a first non-display area B1, a display area A, and a second non-display area B2, for example, according to the first touch line TL1 and the second touch line TL2.

Referring to FIG. 20, the screen division unit 172 may set an area of the display portion 70a between the first touch line TL1 (e.g., the third sensing line SSL3) and a first end 991 of the touch display panel 70 as the first non-display area B. The screen division 172 may set an area of the display portion 70a between the second touch line TL2 (e.g., the (n−2)-th sensing line SSLn−2) and a second end 992 of the touch display panel 70 as the second non-display area B2. The screen division 172 may set an area of the display portion 70a between the first touch line TL1 and the second touch line TL2 as the display area A. Accordingly, the first end 991 of the touch display panel 70 may be positioned inside the first roller housing 22. The second end 992 of the touch display panel 70 may be positioned inside the second roller housing 32.

The panel driver 180 may deactivate the first non-display area B1. For example, the panel driver 180 might not display an image in the first non-display area B1. For example, a data driver 111 of the panel driver 180 may turn off (e.g., turn off light emission in) pixels PX of the first non-display area B1.

Referring to FIG. 12A, in order to deactivate the first non-display area B1, the panel driver 180 might not read sensing signals from touch sensing elements TS located at the first non-display area B1.

The panel driver 180 may deactivate the second non-display area B2. For example, the panel driver 180 might not display an image in the second non-display area B2. For example, the data driver 111 of the panel driver 180 may turn off (e.g., turn off light emission in) pixels PX of the second non-display area B2.

Referring to FIG. 12A, in order to deactivate the second non-display area B2, the panel driver 180 might not read touch sensing signals from touch sensing elements TS located at the second non-display area B2.

According to an exemplary embodiment of the present invention, the panel driver 180 may activate the display area A. For example, the panel driver 180 may display an image in the display area A. The panel driver 180 may turn on (e.g., turns on light in) at least one pixel PX of the display area A.

A sensor driver 161 of the panel driver 180 may drive touch sensing elements TS located at the display area A.

According to an exemplary embodiment of the present invention, the flexible display device 100 according to an exemplary embodiment of the present invention may include a first roller unit or a second roller unit. Accordingly, one end portion of the touch display panel may remain exposed to the outside. For example, when the flexible display device 100 according to an exemplary embodiment includes the first roller unit, a second end portion of the touch display panel may remain exposed to the outside. Such a flexible display device 100 may include one touch bar or one light source unit. A display portion of the touch display panel may be divided into a display area and a non-display area by the one touch bar or the light source unit.

According to one or more exemplary embodiments of the present invention, a non-display area that is hidden from the view of a user may be deactivated. Thus, an image might not be displayed in the non-display area. Additionally, touch sensing elements in the non-display area might not be driven.

Accordingly, a power consumption of the flexible display device may be reduced. Further, since the touch sensing elements in the non-display area might not be driven, touch error problems might not occur, for example, when an unintentional touch is applied to the non-display area.

Entry of foreign matters into the roller housing may be substantially reduced or prevented from entering the flexible display device by the touch bar or the light source unit.

While exemplary embodiments of the present invention have been illustrated and described with reference to the exemplary embodiments thereof, it will be apparent to those of ordinary skill in the art that various changes in form and detail may be made thereto without departing from the spirit and scope of the present invention as defined by the following claims.

What is claimed is:

1. A display device, comprising: a display panel comprising a plurality of pixels and a plurality of light sensing elements: a roller around which at least a portion of the touch display panel is rolled: a roller housing configured to receive the roller and having an opening configured to receive the display panel a light source unit disposed between the roller housing and the display panel, the light source unit irradiating a light toward the display panel; and a panel driver dividing a display portion of the display panel into a display area and a non-display area according to positions of light sensing elements irradiated with the light from the fight source unit, and deactivating at least a portion of the non-display area, wherein the light source unit crosses the display panel in a plan view, wherein a first light sensing element of the plurality of light sensing elements on the display panel is disposed between two touch sensing elements on the display panel.

2. The display device of claim 1, wherein the light source unit is disposed adjacent to the opening.

3. The display device of claim 2, wherein the light source unit is disposed between the roller housing and the display panel, the light source unit being substantially parallel to a central axis of the roller.

4. The display device of claim 1, wherein the light sensing elements are arranged in columns substantially parallel to a central axis of the roller, and the light irradiated from the light source unit is selectively irradiated to the light sensing elements in at least one column.

5. The display device of claim 4, wherein the light source unit has a slit through which the light is emitted.

6. The display device of claim 1, wherein the panel driver defines an area of the display portion between the light sensing elements irradiated with the light from the light source unit and an end of the display panel disposed inside the roller housing as the non-display area.

7. The display device of claim 6, wherein the panel driver detects a touch line according to the positions of the light sensing elements irradiated with the light from the light source unit and defines an area of the display portion between the touch line and the end of the touch display panel disposed inside the roller housing as the non-display area.

8. The display device of claim 7, wherein the light of the light source unit is an ultraviolet light.

9. The display device of claim 1, wherein the light source unit extends in a first direction crossing a second direction in which the display panel moves, and the light source unit crosses two sides of the display panel, the two sides facing each other in the first direction.

10. The display device of claim 1, wherein the first light sensing element of the light sensing elements is substantially aligned with a column of touch sensing elements on the display panel.

11. The display device of claim 1, wherein the two touch sensing elements are of a column of touch sensing elements on the display panel.

\* \* \* \* \*